(12) United States Patent  
Tanaka et al.

(10) Patent No.: US 7,866,533 B2
(45) Date of Patent: Jan. 11, 2011

(54) CONDUCTIVE BALL REMOVING METHOD, CONDUCTIVE BALL MOUNTING METHOD, CONDUCTIVE BALL REMOVING APPARATUS, AND CONDUCTIVE BALL MOUNTING APPARATUS

(75) Inventors: Kazuo Tanaka, Nagano (JP); Kiyoaki Iida, Nagano (JP); Hideaki Sakaguchi, Nagano (JP); Nobuyuki Machida, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 27 days.

(21) Appl. No.: 12/336,875

(22) Filed: Dec. 17, 2008

(65) Prior Publication Data

US 2009/0159646 A1  Jun. 25, 2009

(30) Foreign Application Priority Data

Dec. 19, 2007 (JP) .............................. 2007-327099
Apr. 1, 2008 (JP) .............................. 2008-095296

(51) Int. Cl.
*B23K 1/20* (2006.01)
*B23K 3/06* (2006.01)
(52) U.S. Cl. .......................... 228/176; 228/246; 228/41
(58) Field of Classification Search ................ 228/176, 228/246, 41
See application file for complete search history.

(56) References Cited

U.S. PATENT DOCUMENTS

| 5,431,332 | A | * | 7/1995 | Kirby et al. ................. 228/246 |
| 5,466,908 | A |   | 11/1995 | Hosoya et al. |
| 5,655,704 | A | * | 8/1997 | Sakemi et al. ............... 228/246 |
| 5,918,796 | A | * | 7/1999 | Matsuda et al. .......... 228/248.1 |
| 5,976,269 | A | * | 11/1999 | Hamasaki et al. ............. 134/21 |
| 6,036,787 | A | * | 3/2000 | Bennett et al. ................ 134/21 |
| 2007/0052112 | A1 |   | 3/2007 | Bauer et al. |

FOREIGN PATENT DOCUMENTS

| EP | 0962969 | 12/1999 |
| EP | 1603374 | 12/2005 |
| JP | 9-148332 | 6/1997 |
| JP | 2006-19741 | 1/2006 |
| JP | 2006-173195 | 6/2006 |

* cited by examiner

*Primary Examiner*—Roy King
*Assistant Examiner*—Michael Aboagye
(74) *Attorney, Agent, or Firm*—Rankin, Hill & Clark LLP

(57) ABSTRACT

In a method of removing conductive balls that are left on a mask provided on a substrate having pads thereon, the method includes: (a) making a sheet member close to the mask using a contacting mechanism such that a gap between the sheet member and the mask is set small than a diameter of the conductive balls. The conductive balls are removed in such a manner that the conductive balls are adhered onto the sheet member.

7 Claims, 29 Drawing Sheets

CONDUCTIVE BALL REMOVING METHOD, CONDUCTIVE BALL MOUNTING METHOD, CONDUCTIVE BALL REMOVING APPARATUS, AND CONDUCTIVE BALL MOUNTING APPARATUS

This application claims priority from Japanese Patent Applications Nos. 2007-327099, filed on Dec. 19, 2007, and 2008-095296, filed on Apr. 1, 2008, the entire contents of which are hereby incorporated by reference.

BACKGROUND

1. Technical Field

The present disclosure relates to a conductive ball removing method, a conductive ball mounting method, a conductive ball removing apparatus, and a conductive ball mounting apparatus. More particularly, according to the present disclosure, conductive balls are mounted on a semiconductor substrate (such as a wiring substrate or a silicon wafer) having a plurality of pads thereon through a mask having a plurality of through holes and then remaining conductive balls that have not been directly mounted on the pads are removed.

2. Background Art

In mounting a semiconductor device such as Large Scale Integration (LSI), Liquid Crystal Display (LCD), or the like on a mounting substrate by flip-chip bonding, electric connections are provided by putting micro particles made of conductive metal between electrode pads of a semiconductor device and electrode pads of the mounting substrate and then applying thermo-compression bonding to the micro particles. As the micro particle, a conductive ball such as a solder ball is used.

In order to achieve the electric connection between the pads by using such conductive ball, prior to the thermocompression bonding, each of the conductive balls must be mounted on corresponding one of all pads designed to be aligned. Therefore, in order to mount each of the conductive balls on corresponding one of the pads as aligned, there is known a method of dropping a sufficient number of conductive balls onto the pads through a mask having the same alignment as the pads.

Such a method of dropping the conductive balls through the mask is a simple method, but surplus conductive balls are put inevitably on the mask. FIG. 1 shows a state that the surplus conductive balls are mounted on the mask. As a result of dropping conductive balls 38 through a mask 12 to mount each of the conductive balls 38 on corresponding one of the pads 27 formed on an upper surface of a wiring substrate 18, some conductive balls are put on the mask 12 and other conductive balls are put on the conductive balls being directly mounted on each pad 27.

Therefore, surplus conductive balls need to be removed on the mask after the mounting operation before removing the mask. This is because, if the mask is removed in such a condition that the removal of the surplus conductive balls is still insufficient, two conductive balls are stacked on the pad 27 (double balls), which leads to a failure of short-circuit between the pads. A situation that the double balls occur after the mask is removed is shown in FIG. 2.

As the method of removing such surplus conductive balls, there are a method using a brush and a method using an air blow.

According to the method using the brush, the conductive balls are removed by moving the conductive balls with the brush. For example, JP-A-9-148332 describes the method of moving the conductive balls using the brush-like squeegee on which electrically conductive fibers are implanted. Also, JP-A-2006-19741 describes an example of the method of moving the conductive balls using the squeegee on which a plurality of sweeping members are aligned in a multiple fashion. Further, JP-A-2006-173195 describes an example of the method of moving the conductive balls by bringing fiber sweeping members into contact with a surface of the mask and then moving the sweeping members while deforming them.

According to the method using an air blow, the conductive balls are moved by using an air jet from the air blow as a driving force. For example, JP-A-2006-19741 describes an example of the method of moving the conductive balls by using the head equipped with air nozzles. Also, JP-A-2006-173195 describes an example of the method of moving the conductive balls by using a removing head, in which the conductive balls are blown away by blowing an air obliquely downward toward the mask.

However, in the conductive ball removing method in the related art, the following disadvantages existed.

In the method of using the brush, when the brush is used continuously, the conductive balls enter into the brush and thus the removal cannot be completely achieved. Also, when the brush is used continuously, the conductive balls enter into the implanted fibers and do not come out of the implanted fibers, and thus the subsequent removal of the conductive balls becomes difficult. Also, sometimes the conductive balls that have entered into the implanted fibers once drop on the area where the removal has already been completed, and thus the reliable removal becomes difficult.

Further, in the method of using the air blow, the conductive balls are scattered by the air. When the conductive balls are scattered, sometimes such balls are returned to the area where the removal has already been completed, and thus the reliable removal becomes difficult.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any of the problems described above.

Accordingly, it is an object of the present invention to provide a conductive ball removing method, a conductive ball mounting method, a conductive ball removing apparatus, and a conductive ball mounting apparatus, capable of removing surplus conductive balls without fail not to scatter the conductive balls.

According to one or more aspects of the present invention, there is provided a method of removing conductive balls that are left on a mask provided on a substrate having pads thereon. The method includes: (a) making a sheet member close to the mask using a contacting mechanism such that a gap between the sheet member and the mask is set small than a diameter of the conductive balls. The conductive balls are removed in such a manner that the conductive balls are adhered onto the sheet member.

According to one or more aspects of the present invention, step (a) includes: making the sheet member close to the mask by an air pressure from the contacting mechanism.

According to one or more aspects of the present invention, in step (a), the contacting mechanism applies a force to the sheet member via an elastic member.

According to one or more aspects of the present invention, there is provided a method of removing conductive balls that are left on a mask provided on a substrate having pads thereon. The method includes: (a) making a sheet member close to the mask by means of its own weight such that a gap between the sheet member and the mask is set small than a diameter of the conductive balls. The conductive balls are removed in such a manner that the conductive balls are adhered onto the sheet member.

According to one or more aspects of the present invention, the method further includes: (b) moving the sheet member over the mask.

According to one or more aspects of the present invention, the method further includes: (c) updating a contact face between the sheet member and the mask in response to a moving velocity of the sheet member.

According to one or more aspects of the present invention, there is provided a method of mounting conductive balls on pads provided on a substrate. The method includes: (a) mounting each of the conductive balls on a corresponding one of the pads through a mask having through holes corresponding to the pads; and (b) making a sheet member close to the mask using a contacting mechanism such that a gap between the sheet member and the mask is set small than a diameter of the conductive balls. Surplus conductive balls that are not directly mounted on the pads are removed such that the surplus conductive balls are adhered onto the sheet member.

According to one or more aspects of the present invention, there is provided a conductive ball removing apparatus for removing conductive balls that are left on a mask provided on a substrate having pads thereon. The apparatus includes: a sheet member onto which the conductive balls are to be adhered; and a contacting mechanism configured to make the sheet member close to the mask such that a gap between the sheet member and the mask is set small than a diameter of the conductive balls.

According to one or more aspects of the present invention, the contacting mechanism makes the sheet member close to the mask using an air pressure.

According to one or more aspects of the present invention, the contacting mechanism applies a force to the sheet member via an elastic member.

According to one or more aspects of the present invention, there is provided a conductive ball removing apparatus for removing conductive balls that are left on a mask provided on a substrate having pads thereon. The apparatus includes: a sheet member onto which the conductive balls are to be adhered and which comes close to the mask by its own weight.

According to one or more aspects of the present invention, the apparatus further includes: a moving mechanism configured to move the sheet member over the mask.

According to one or more aspects of the present invention, the apparatus further includes: an updating mechanism configured to update a contact face between the sheet member and the mask, in response to a moving velocity of the sheet member.

According to one or more aspects of the present invention, the contacting mechanism comprises a plurality of contacting mechanisms.

According to one or more aspects of the present invention, the contacting mechanism includes an oscillation mechanism configured to swing in a direction perpendicular to an extending direction of a contact face between the sheet member and the mask.

Other aspects and advantages of the present invention will be apparent from the following description, the drawings, and the claims.

DETAILED DESCRIPTION OF EXEMPLARY EMBODIMENTS OF THE INVENTION

Exemplary embodiments of the present invention will be now described with reference to the drawings hereinafter.

First Embodiment

Figure 1:
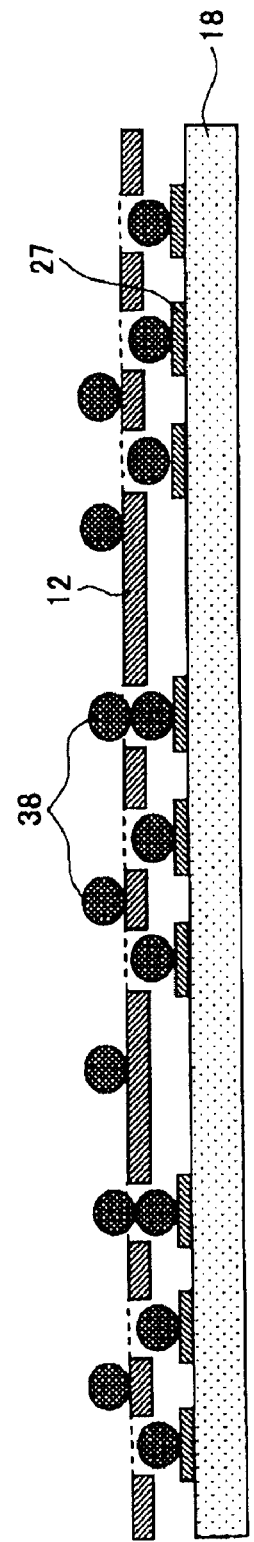
FIG. 1 is a sectional view showing a state that conductive balls are mounted by a conductive ball mounting method in the related art.
Figure 2:
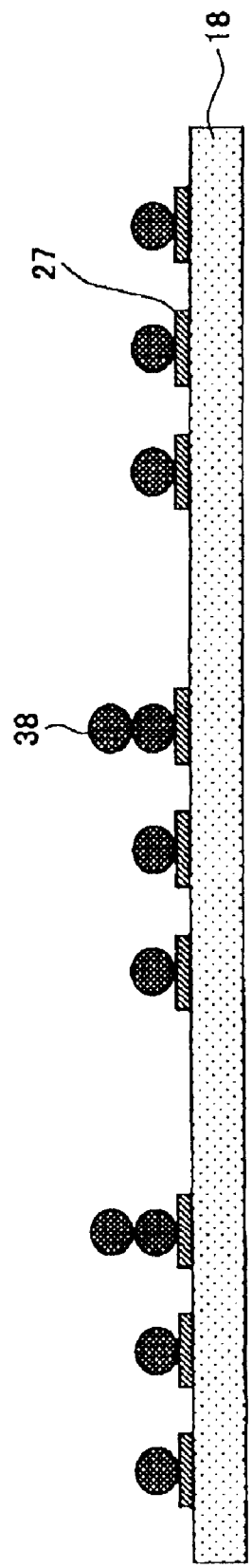
FIG. 2 is a sectional view showing a state that the conductive balls are mounted by the conductive ball mounting method in the related art.
Figure 3:
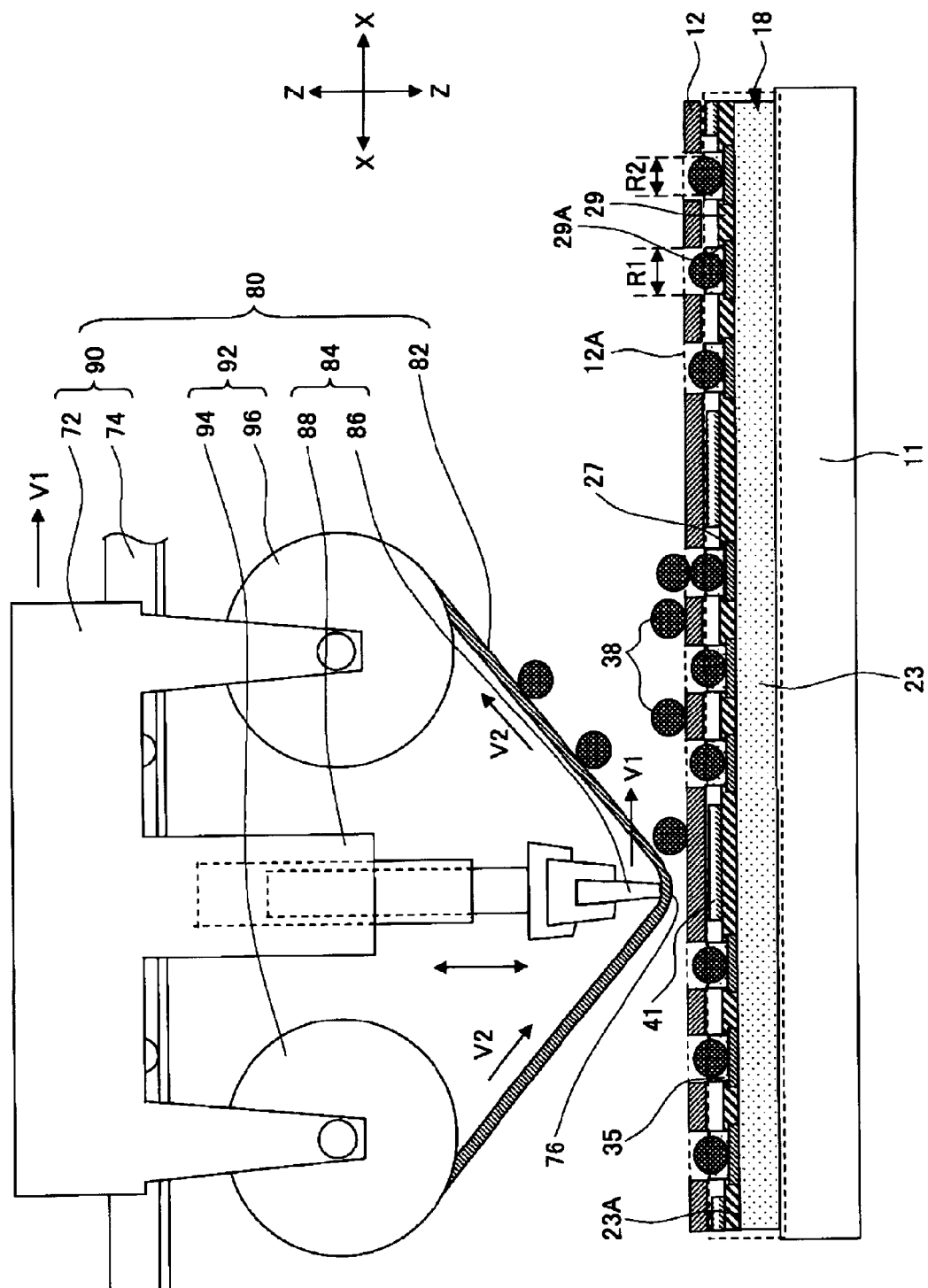
FIG. 3 is a schematic view showing a state that conductive balls are removed using a conductive ball removing apparatus according to a first embodiment of the present invention.

A conductive ball removing apparatus according to a first embodiment of the present invention will be explained with reference to FIG. 3 hereinafter. FIG. 3 is a view explaining a conductive ball removing apparatus 80, and shows schematically such a situation that a contacting mechanism 84 disposed over the mask 12 allows a sheet member 82 to come close to (or contact with) the mask 12 so as to remove the conductive balls 38 that have not been directly mounted on the pads 27. Also, in FIG. 3, Z-Z direction denotes the vertical direction, and an X-X direction denotes directions perpendicular to the Z-Z direction. Also, the sheet member 82 need not be contact with the mask 12 in removing the conductive balls 38. However, a gap between the sheet member 82 and the mask 12 is very small and the gap is smaller than a diameter of the conductive ball, as described later.

By reference to FIG. 3, the conductive ball removing apparatus 80 of the first embodiment includes the sheet member 82, the contacting mechanism 84, a moving mechanism 90, and an updating mechanism 92. The conductive ball removing apparatus 80 is disposed over the mask 12 fixed on the wiring substrate 18 on a stage 11.

At first, the wiring substrate 18 (or a semiconductor substrate such as a wafer on which an electronic circuit is formed) held by the stage 11 will be explained hereunder. The wiring substrate 18 is a wiring substrate used in the flip-chip bonding, or the like, and includes a substrate 23, the pads 27, a solder resist 29, and an adhesive material 35. As the material of the substrate 23, for example, a glass epoxy resin can be used. The pads 27 are provided on an upper surface 23A of the substrate 23. Each of the conductive balls 38 serving as an external connection terminal of the wiring substrate 18 is mounted on a corresponding one of the pads 27 via the adhesive material 35. As the conductive balls 38, for example, a solder ball, a copper core ball, or a resin core ball can be used. The copper core ball is formed by coating a core ball made of copper with a solder. The resin core ball is formed by coating a core ball made of resin with a solder. Also, a diameter of the conductive ball 38 can be set to 10 to 100 μm, for example. The solder resist 29 is provided on the upper surface 23A of the substrate 23, and has opening portions 29A that expose the pad 27 respectively. The adhesive material 35 is provided on the pads 27 exposed from the opening portions 29A respectively. The adhesive material 35 is used to temporarily fix the conductive balls 38 onto the pads 27. As the adhesive material 35, for example, a flux, a solder paste, or the like can be used.

The wiring substrate 18 constructed as above is held on the stage 11 such that a plurality of pads 27 on which the adhesive material 35 is formed respectively oppose to the conductive ball removing apparatus 80.

The stage 11 is provided to hold the wiring substrate 18. The mask 12 is fixed on the wiring substrate 18 via a resist film 41 that is formed on the solder resist 29 (otherwise, the mask 12 may be directly disposed on the wiring substrate without the resist film 41). Further, supporting member may be formed integrally with the mask 12 instead of providing the resist film 41. The mask 12 has a plurality of through portions 12A. The through portions 12A are formed to pass through portions of the mask 12 corresponding to forming positions of the pads 27. A diameter R1 of the through portion 12A is set to a size through which only one conductive ball 38 can pass (a size that is slightly larger than a diameter R2 of the conductive ball 38). Concretely, when a diameter R2 of the conductive ball 38 is set to 100 μm, a diameter R1 of the through portion 12A of the mask 12 can be set to 120 μm, for example. Also, as the material of the mask 12, for example, a metal can be used.

The sheet member 82 is provided to remove the conductive balls 38 that have not been directly put on the pads 27. As the sheet member 82, a fiber such as a cloth or a paper; a film such as PET; or an adhesive film can be used. A surface of the sheet member 82, which is brought into contact with the mask 12, has an attracting force caused by a static electricity, a catching action by the fiber, or an adhesive force. When the sheet member 82 is brought into contact with (or comes close to) the mask 12, the conductive balls 38 that have not been directly mounted on the pads 27 are attracted by an attracting force caused by a static electricity of the sheet member 82. As the sheet member 82, for example, a cloth whose Young's modulus is 0.1 to 100 MPa and whose thickness is 50 to 500 μm can be used.

Figure 4:
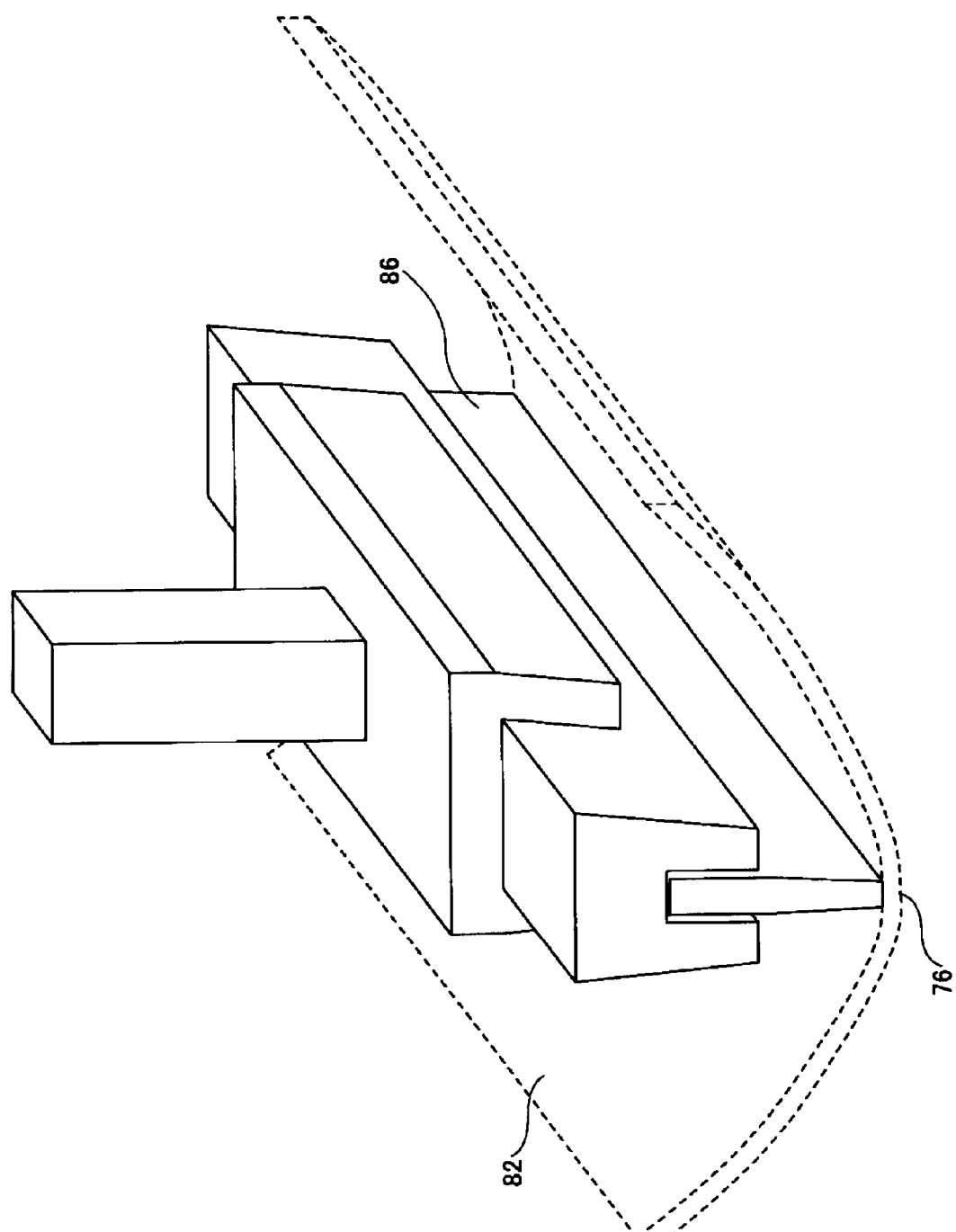
FIG. 4 is a view explaining the conductive ball removing apparatus according to the first embodiment of the present invention, and shows a perspective view of a squeegee constituting a contacting mechanism.

The contacting mechanism 84 is provided to bring the sheet member 82 into contact with the mask 12. The contacting mechanism 84 includes a squeegee 86 and a cylinder 88. The squeegee 86 is a member to bring the sheet member 82 into contact with the mask 12. A perspective view of the squeegee 86 is shown in FIG. 4. As shown in FIG. 4, the squeegee 86 has a plate-like shape that is long along in one direction and is short in the direction perpendicular to one direction, and is shaped such that the sheet member 82 can be brought into the mask 12 by a band-like contact face 76. As the squeegee 86, for example, a metal squeegee having a Young's modulus of 30 to 300 GPa, a thickness of 0.05 to 20 mm, and a length of 100 to 300 mm may be used. The cylinder 88 is provided to control either a pressure when the squeegee 86 comes into contact with the mask 12, or a height when the squeegee 86 comes close to the mask 12 at a predetermined distance. As the cylinder 88, for example, an air cylinder may be used. When unevenness is present on the wiring substrate 18 (the mask 12), the cylinder 88 is movable up and down in response to the unevenness.

Figure 5:
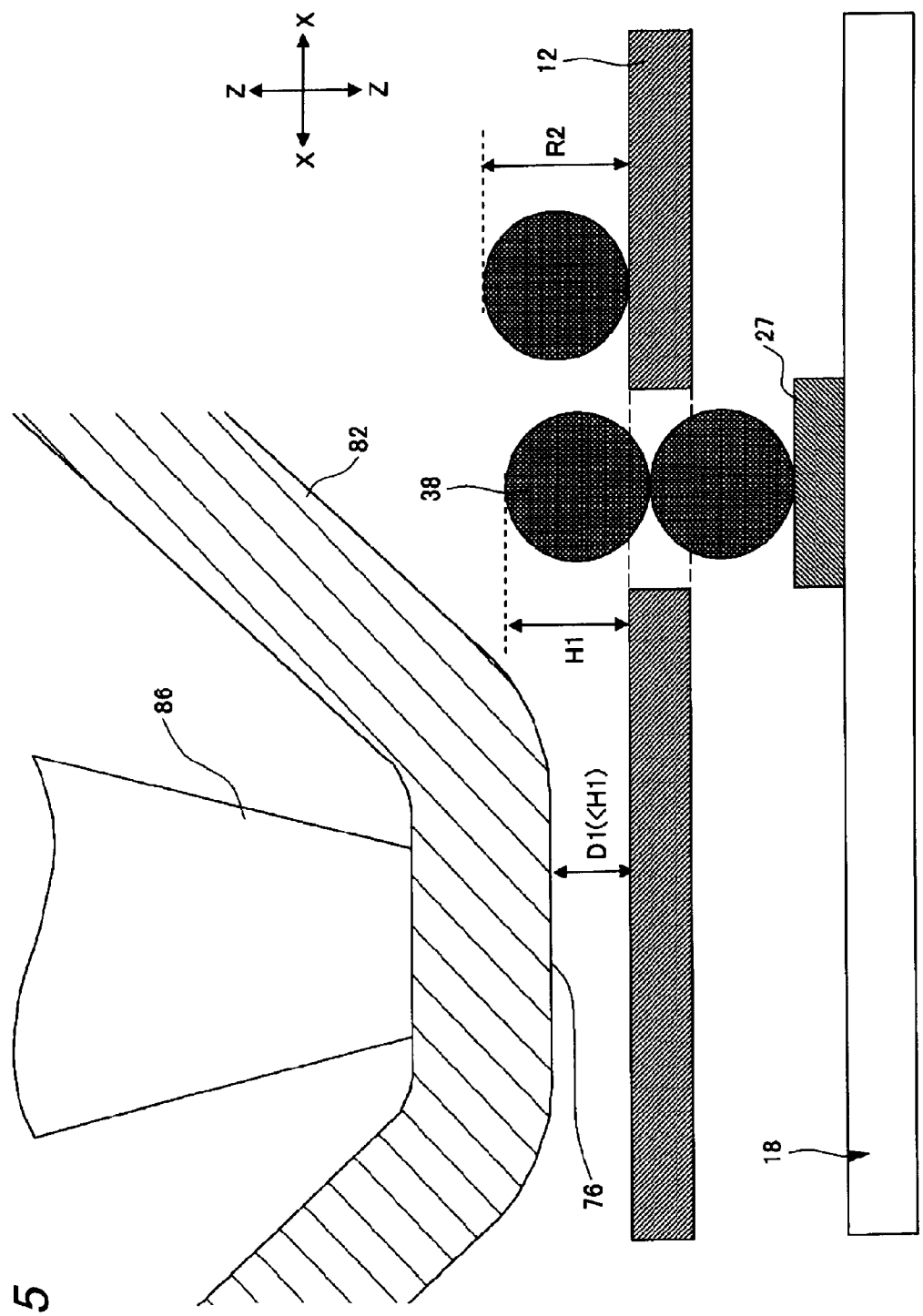
FIG. 5 is a view explaining the conductive ball removing apparatus according to the first embodiment of the present invention, and shows an enlarged view of a contact face, on which a sheet member is brought into contact with a mask, and its neighborhood.

FIG. 5 shows a situation that the sheet member 82 is just about to come into contact with the mask 12 at the contact face 76. Here, commonly the wording "come into contact" means that one is brought into touch with the other. In the present invention, the wording "come into contact" also contains such a meaning that one comes close to the other, and may be used when the sheet member 82 does not come into touch with the mask 12 but comes close to the mask 12. This is because, when the distance D1 between the sheet member 82 and the mask 12 is reduced smaller than the diameter R2 of the conductive ball even though the sheet member 82 does not come into touch with the mask 12, the conductive balls 38 that have not been directly mounted on the pads 27 but remain on the surface of the mask 12 can be adhered to the sheet member 82 and removed from there. In this case, an upper surface of the conductive ball 38 (double ball) being stacked on the conductive ball 38 that has been directly mounted on the pad 27 is set at a height H1 that is slightly lower than the conductive ball 38 that remains on the surface of the mask 12. Therefore, the cylinder 88 controls such that the distance D1 is set in a range of D1<H1.

According to such contacting mechanism 84, the conductive balls 38 that have not been directly mounted on the pads 27 can be adhered to the sheet member 82 or moved on the periphery of the mask 12.

The moving mechanism 90 is provided to move the sheet member 82 on the mask 12 while bringing it into contact with the mask 12. As shown in FIG. 3, the moving mechanism 90 includes a truck 72 that moves in parallel with the stage 11 and a rail 74. The cylinder 88 of the contacting mechanism 84 is fixed to the moving mechanism 90, so that the moving mechanism 90 can be moved on the mask 12 while bringing the squeegee 86 of the contacting mechanism 84 into contact with the mask 12.

According to the moving mechanism 90, the step of causing the conductive balls 38 that have not been directly mounted on the pads 27 to adhere to the sheet member 82 can be performed over the whole surface of the mask 12.

The updating mechanism 92 is provided to update the contact face 76 of the sheet member 82, which is brought into contact with the mask 12, in response to a moving velocity of the sheet member 82. As shown in FIG. 3, the updating mechanism 92 includes an unwinding roller 94 and a winding roller 96, both being rotated/driven by a motor. The sheet member 82 is shaped into a roller, and is loaded by the unwinding roller 94. When the sheet member 82 is moved over the mask 12 by the moving mechanism 90 in a state that this sheet member 82 is brought into contact with the mask 12 by the contacting mechanism 84, the unwinding roller 94 and the winding roller 96 is rotated in response to a moving velocity V1, at which the moving mechanism 90 is moved, to unwind/wind the sheet member 82 such that the sheet member 82 passes through the squeegee 86 at an updating velocity V2. That is, the contact face 76 of the sheet member 82 contacting to the mask 12 is updated at the updating velocity V2. As a result, the sheet member 82 being unwound from the unwinding roller 94 comes into contact with the mask 12 at the contact face 76, then picks up the surplus conductive balls 38, and then is wound by the winding roller 96.

Here, when V2>V1, the sheet member 82 comes into contact with the mask 12 while updating the contact face 76. In contrast, when V2<V1, the update of the sheet member 82 cannot catch up to the movement of the sheet member 82 on the mask 12, and other conductive balls 38 comes into contact with the contact face 76 onto which the conductive balls 38 have already been adhered once. Therefore, the adhesion and removal of the conductive balls 38 cannot be surely performed. As a result, the updating velocity V2 is set larger than the moving velocity V1.

With the updating mechanism 92, the contact face 76 at which the sheet member 82 contacts the mask 12 can be updated in response to the moving velocity V1 of the contacting mechanism 84 over the mask 12. Therefore, the sheet member 82 can come into contact with the mask 12 in a condition that the sheet member 82 can always hold an adhesive force. As a result, such a situation can be prevented that the conductive balls 38 that have not been directly mounted on the pads 27 is not removed or the conductive balls 38 that have been adhered onto the sheet member 82 once are dropped on the mask 12, and thus the removal can be performed without fail.

FIG. 6 to FIG. 10 are process views explaining the conductive ball removing method using the conductive ball removing apparatus according to the first embodiment of the present invention. In FIG. 6 to FIG. 10, the same reference symbols are affixed to the same constituent portions as those explained previously and shown in FIG. 3.

The conductive ball removing method according to the first embodiment of the present invention will be explained with reference to FIG. 6 to FIG. 10 hereunder.

Figure 6:
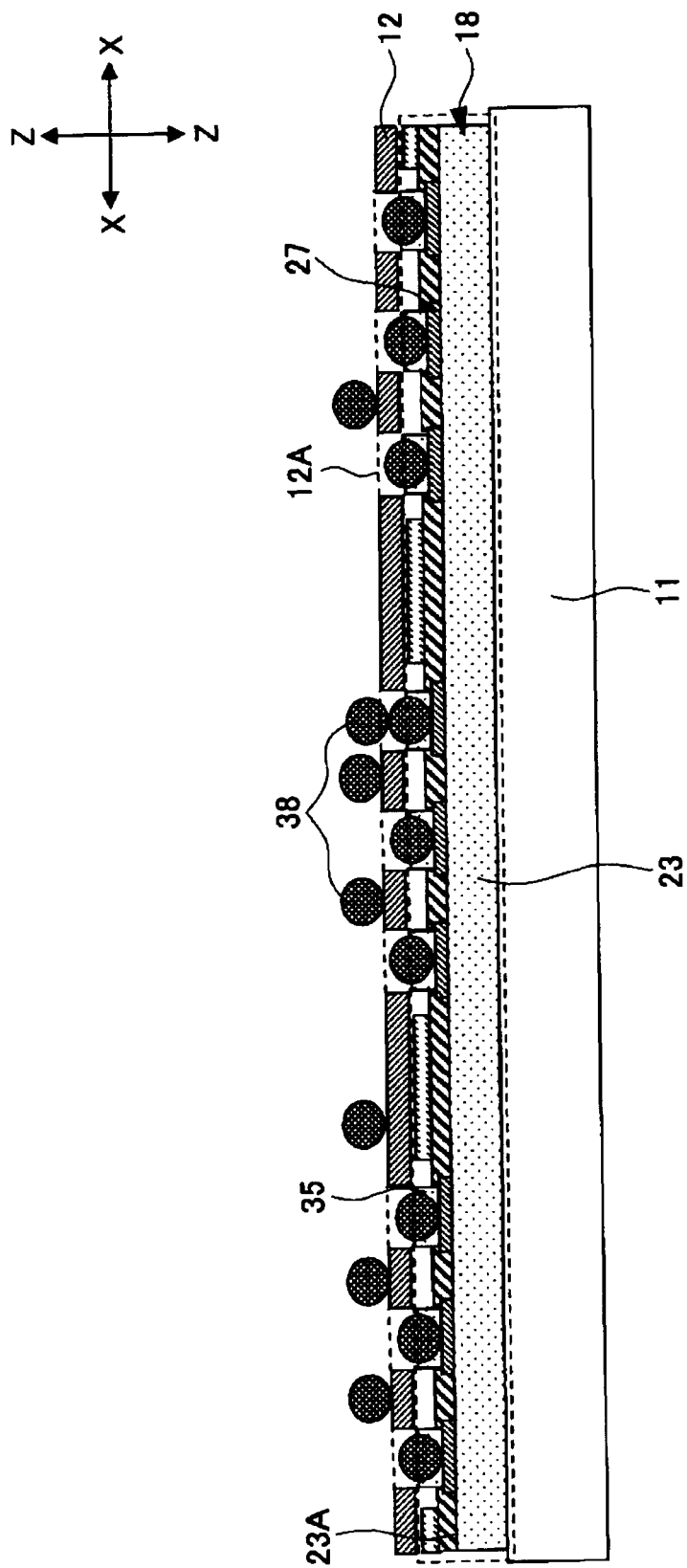
FIG. 6 is a process view (#1) explaining a conductive ball removing method according to the first embodiment of the present invention.

At first, FIG. 6 shows a state that the conductive balls 38 are mounted on the wiring substrate 18 after the conductive balls 38 are mounted on the pads 27 through the mask 12 respectively. Each of the conductive balls 38 is mounted on a corresponding one of the plurality of pads 27, but the surplus conductive balls 38 are present on the mask 12. In this case, a height of the upper surface of the conductive ball 38 mounted on the pad 27 is somewhat lower than a height of the upper surface of the mask 12. Therefore, some conductive balls 38 are fitted into the through portions 12A of the mask 12 from the upper surface of the mask 12, and then are stacked on the conductive ball 38 that has already been mounted (double ball state).

Figure 7:
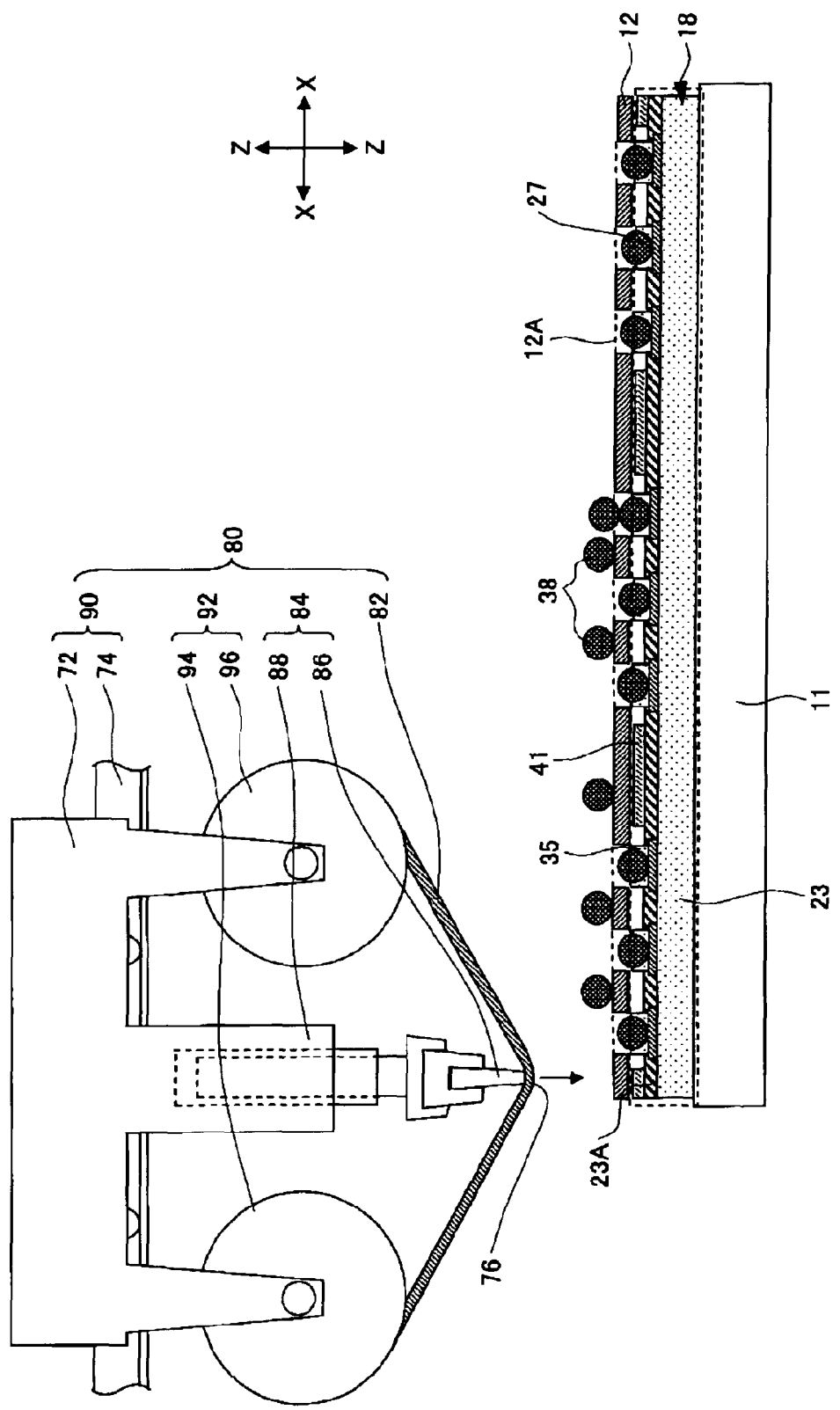
FIG. 7 is a process view (#2) explaining the conductive ball removing method according to the first embodiment of the present invention.

Then, in the step shown in FIG. 7, the mask 12 and the sheet member 82 are arranged to oppose to each other, and the sheet member 82 is brought into contact with the mask 12 by using the contacting mechanism 84 of the conductive ball removing apparatus 80 that is equipped with the sheet member 82, the contacting mechanism 84, the moving mechanism 90, and the updating mechanism 92. Concretely, the squeegee 86 of the contacting mechanism 84 is brought close to the mask 12 by using the cylinder 88 constituting the contacting mechanism 84, and is maintained to oppose to the mask 12 at the distance D1 shown in FIG. 5.

Figure 8:
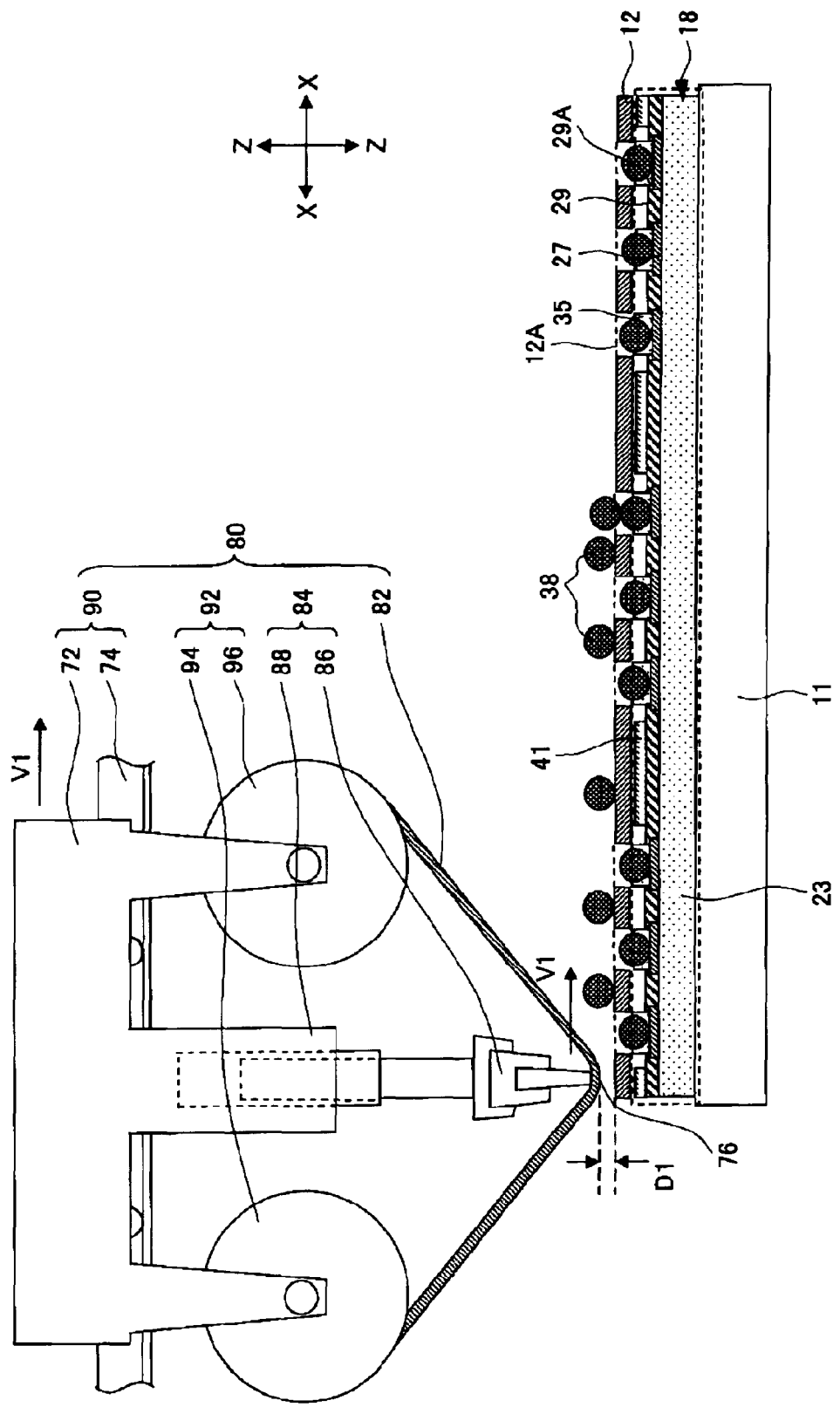
FIG. 8 is a process view (#3) explaining the conductive ball removing method according to the first embodiment of the present invention.

Then, in the step shown in FIG. 8, the sheet member 82 that is brought into contact with the mask 12 at the distance D1 is moved over the mask 12 at the moving velocity V1 by the moving mechanism 90 of the conductive ball removing apparatus 80. Concretely, the moving mechanism 90 is moved along the rail 74 by the truck 72 constituting the moving mechanism 90.

Figure 9:
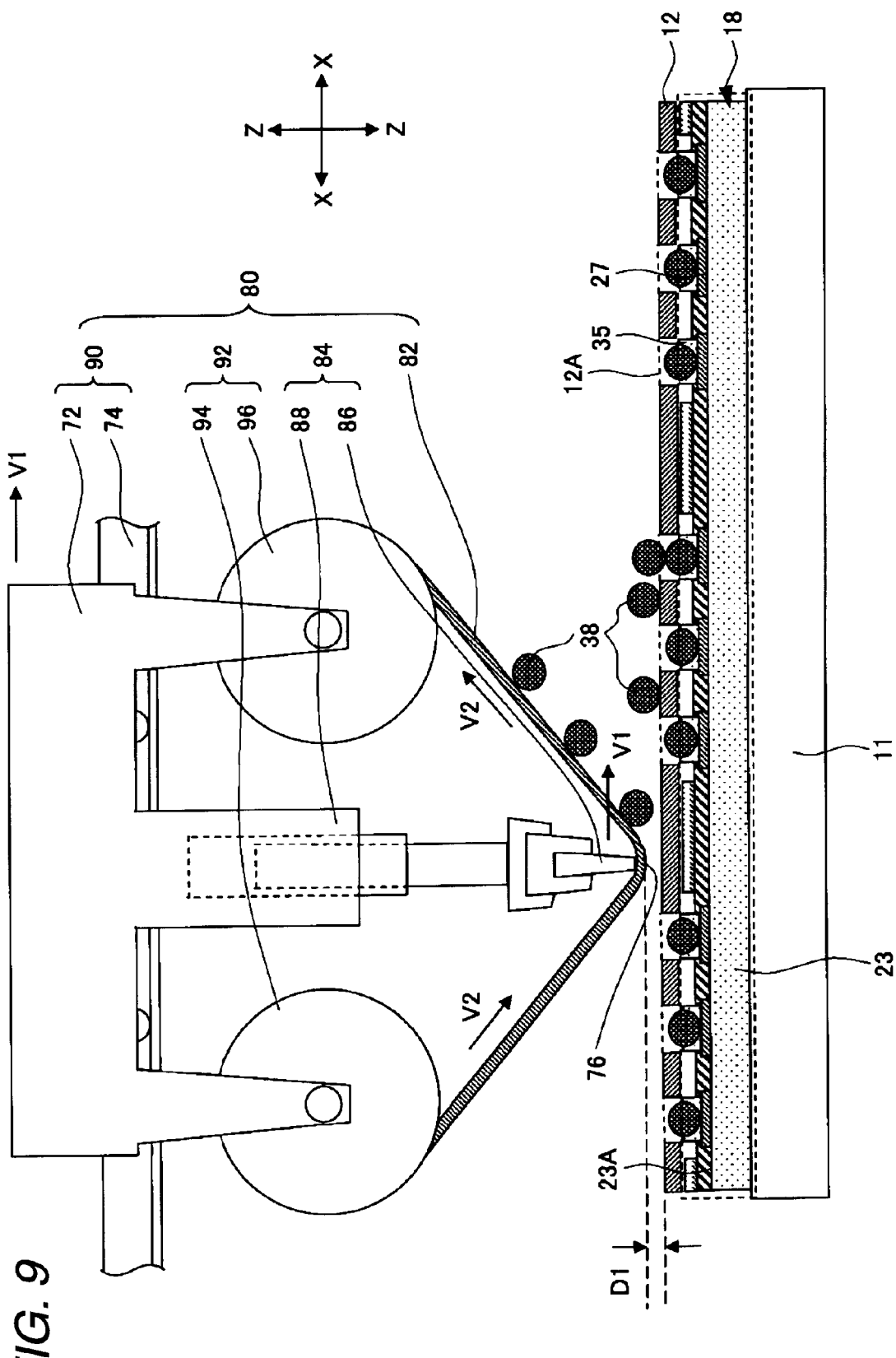
FIG. 9 is a process view (#4) explaining the conductive ball removing method according to the first embodiment of the present invention.

Then, in the step shown in FIG. 9, the conductive ball removing apparatus 80 is moved at the moving velocity V1 by the moving mechanism 90, and the contact face 76 at which the sheet member 82 is brought into contact with the mask 12 is updated at the updating velocity V2 by the updating mechanism 92 of the conductive ball removing apparatus 80. Then, the surplus conductive balls 38 are removed sequentially. Concretely, the updating velocity V2 is set larger than the moving velocity V1. As a result, the surplus conductive balls 38 can be removed such that the conductive balls 38 that have been adhered to the sheet member 82 once are never dropped on the mask 12 again.

Figure 10:
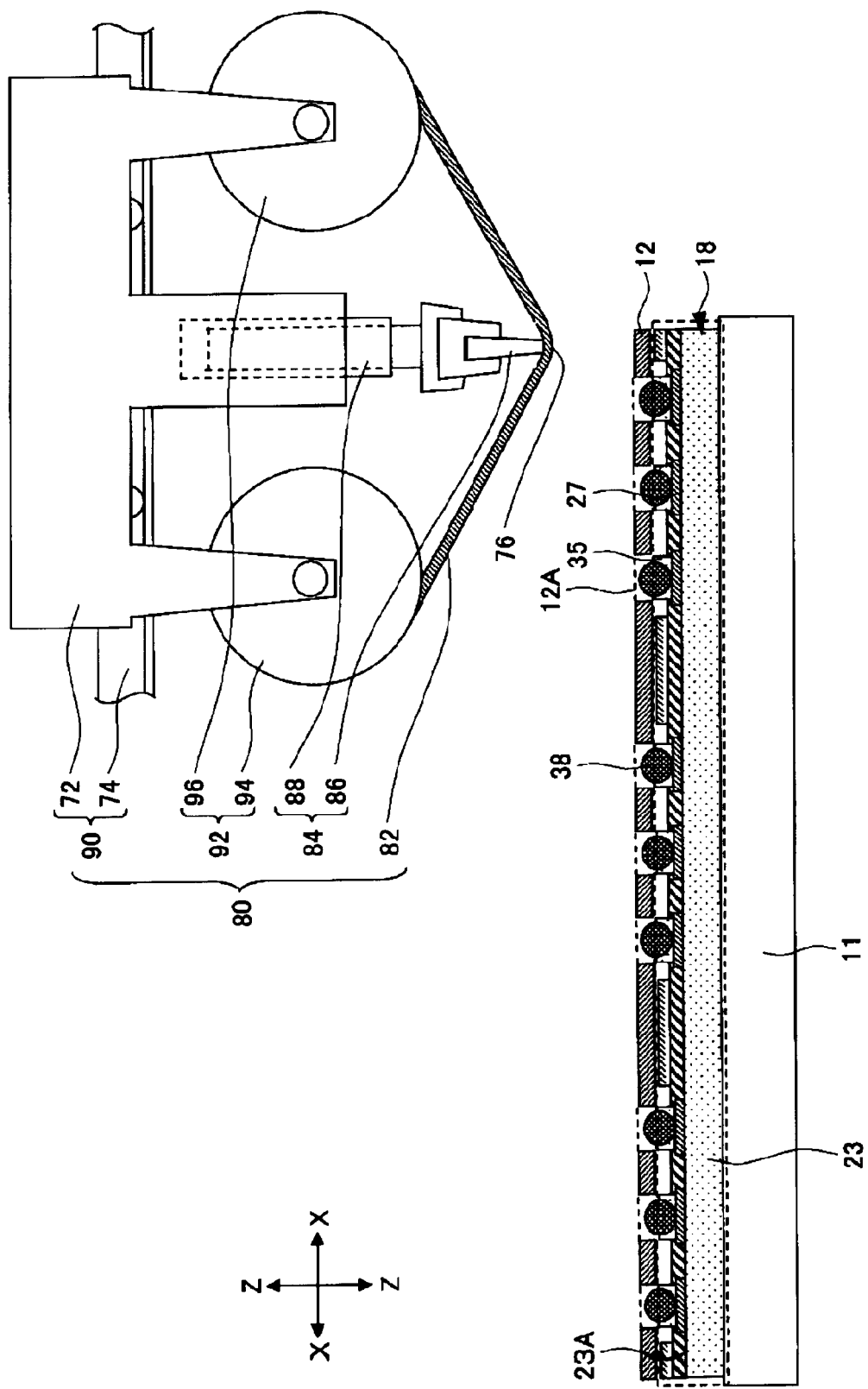
FIG. 10 is a process view (#5) explaining the conductive ball removing method according to the first embodiment of the present invention.

Finally, FIG. 10 is a process view showing a state immediately after the conductive ball 38 is removed by the conductive ball removing apparatus 80. After all surplus conductive balls 38 are adhered onto the sheet member 82 and are wound/removed by the winding roller 96, only the conductive balls 38 that have been mounted directly on the pads 27 remain on the mask 12. After the conductive balls 38 are removed from the whole surface of the wiring substrate 18, the sheet member 82 is separated from the mask 12 by the cylinder 88 of the contacting mechanism 84 of the conductive ball removing apparatus 80.

As described above, according to the conductive ball removing apparatus of the present embodiment, while bringing the sheet member 82, onto which the conductive balls 38 are adhered, into contact with the mask 12, the sheet member 82 is moved over the mask 12 while updating the contact face 76 that contacts the mask 12 by the moving mechanism 90 and the updating mechanism 92. Therefore, the conductive balls 38 that have not been directly mounted on the pads 27 can be removed from the mask 12 without fail. Otherwise, the conductive balls 38 may be removed after the wiring substrate 18, on which the conductive balls 38 are mounted, is removed.

In the present embodiment, the case where the cloth having an attracting force generated by the static electricity is used as the sheet member 82 is explained by way of example. But any force except the static electricity may be employed if such force can attract the conductive ball 38. Also, a fiber such as a paper except the cloth or a film may be used as the sheet member 82 if such material can wind and unwind like a roll.

First Variation

Figure 11:
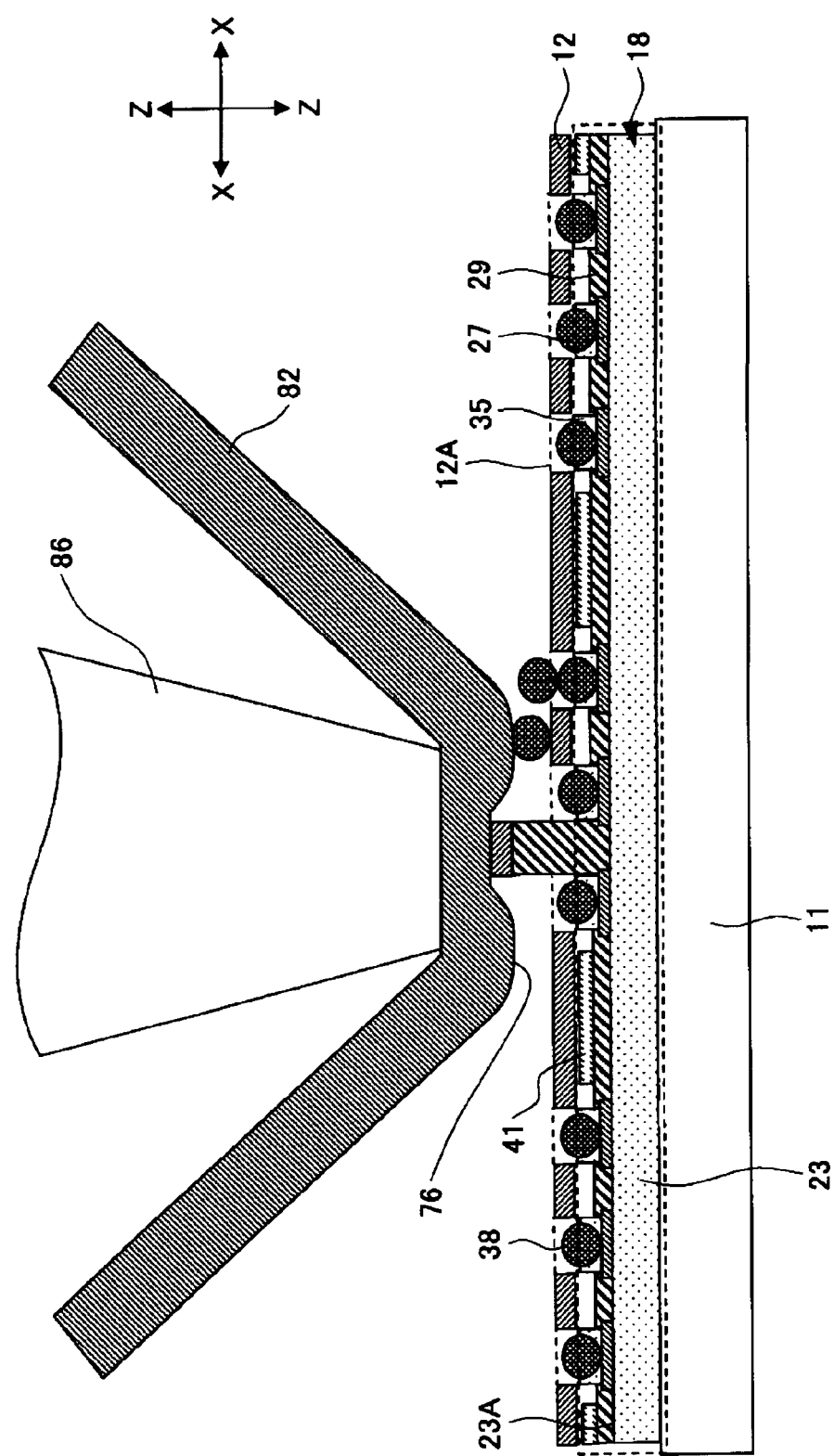
FIG. 11 is a view explaining the conductive ball removing apparatus according to a first variation of the first embodiment of the present invention, and shows an enlarged view of a contact face, on which a sheet member is brought into contact with a mask, and its neighborhood.

Next, a first variation of the first embodiment will be explained with reference to FIG. 11 hereunder.

A conductive ball removing apparatus according to the present variation is different from the first embodiment in that, in the first embodiment, the thin member is used as the sheet member 82 whereas, in the present variation, a thicker member is used or a more flexible material is used to provide flexibility to the sheet member 82.

Concretely, in the first embodiment, the cloth having a Young's modulus of 0.1 to 100 MPa and a thickness of 50 to 500 μm is used as the sheet member 82 whereas, in the present variation, a cloth having a Young's modulus of 0.1 to 1.0 MPa and a thickness of 0.1 to 1 mm is used. For example, a felt having a thickness of 0.5 mm (Young's modulus of 0.5 MPa) may be used. When thicknesses of respective layers of the wiring substrate 18 are different due to a variation in production steps and unevenness is present partially, the sheet member 82 can follow the unevenness, as shown in FIG. 11, by providing the flexibility to the sheet member 82. For convenience of explanation, a size of the unevenness is extremely illustrated in FIG. 11.

In this manner, according to the present embodiment, even when the unevenness is present on the wiring substrate 18 or warpage is present on the wiring substrate 18, the sheet member 82 can come surely into contact with the mask 12 by providing the flexibility to the sheet member 82. Therefore, productivity can be improved in the step of removing the conductive balls 38 that have not been directly mounted on the pads 27.

In the present variation, an example in which the sheet member 82 is made thicker and also the sheet member 82 is replaced with the soft material is described. The similar advantages can be obtained by changing only either the thickness or the flexibility.

Second Variation

Figure 12:
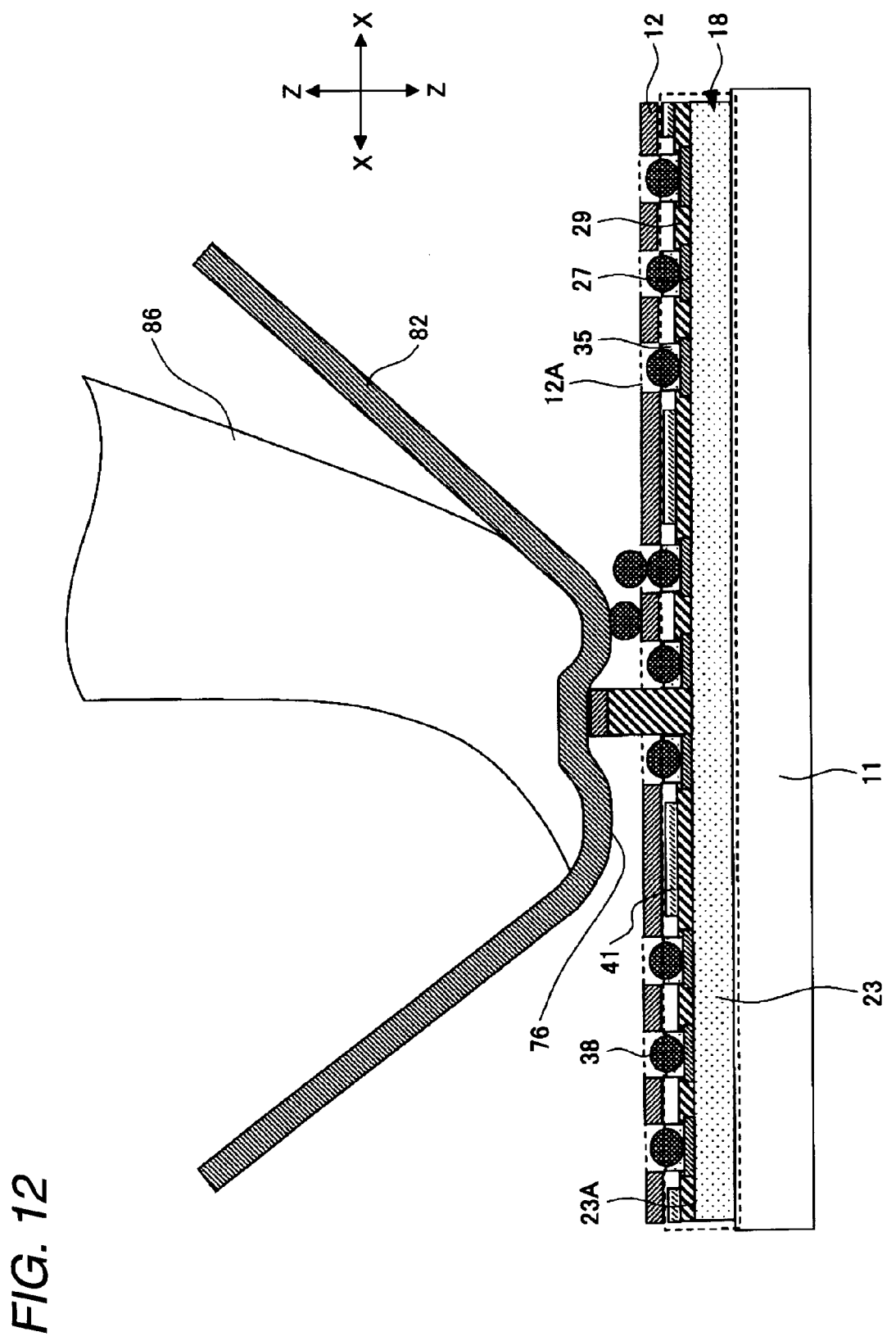
FIG. 12 is a view explaining the conductive ball removing apparatus according to a second variation of the first embodiment of the present invention, and shows an enlarged view of a contact face, on which a sheet member is brought into contact with a mask, and its neighborhood.

Next, a second variation of the first embodiment will be explained with reference to FIG. 12 hereunder.

A conductive ball removing apparatus according to the present variation is different from the first embodiment in that, in the first embodiment, the hard member is used as the squeegee 86 whereas, in the present variation, a thinner member is used or a more flexible material is used to provide the flexibility to the squeegee 86.

Concretely, in the first embodiment, the metal squeegee having a Young's modulus of 30 to 300 GPa and a thickness of 0.05 to 20 mm is used as the squeegee 86 whereas, in the present variation, a resin squeegee having a Young's modulus of 5 to 500 MPa and a thickness of 0.01 to 20 mm is used. For example, a silicone rubber squeegee having a thickness of 5 mm (Young's modulus of 30 MPa) may be used. When thicknesses of respective layers of the wiring substrate 18 are different due to a variation in production steps and unevenness is present partially, the squeegee 86 can follow the unevenness, as shown in FIG. 12, by providing the flexibility to the squeegee 86. For convenience of explanation, a size of the unevenness is extremely illustrated in FIG. 11.

In this manner, according to the present variation, the flexibility is given to the sheet member 82. Therefore, even when the unevenness is present on the wiring substrate 18 or warpage is present on the wiring substrate 18, the sheet member 82 can come surely into contact with the mask 12. Thus, productivity can be improved in the step of removing the conductive balls 38 that have not been directly mounted on the pads 27.

In the present variation, an example in which a thickness of the squeegee 86 is made thin and also the squeegee 86 is replaced with the soft material is illustrated. The similar advantages can be achieved by changing only either the thickness or the flexibility.

Third Variation

Next, a third variation of the first embodiment will be explained with reference to FIG. 13 hereunder.

A conductive ball removing apparatus according to the present variation is different from the first embodiment in that, in the first embodiment, the single-body squeegee 86 whose longitudinal direction is perpendicular to the moving direction of the moving mechanism 90 is used whereas, in the present variation, a plurality of short squeegees 86 whose length is divided in the longitudinal direction are provided and an oscillation mechanism 78 is provided to the squeegees 86 respectively.

Concretely, in the first embodiment, the squeegee having a length of 100 to 300 mm is used as the squeegee 86 whereas, in the present variation, a plurality of squeegees 86 each having a length of 5 to 50 mm are provided. For example, the squeegees each having a length of 10 mm may be provided at an interval of 5 mm. When thicknesses of respective layers of the wiring substrate 18 are different due to a variation in production steps and unevenness is present partially, the squeegee 86 can follow the unevenness, as shown in FIG. 13, by using a plurality of squeegees 86.

Figure 13:
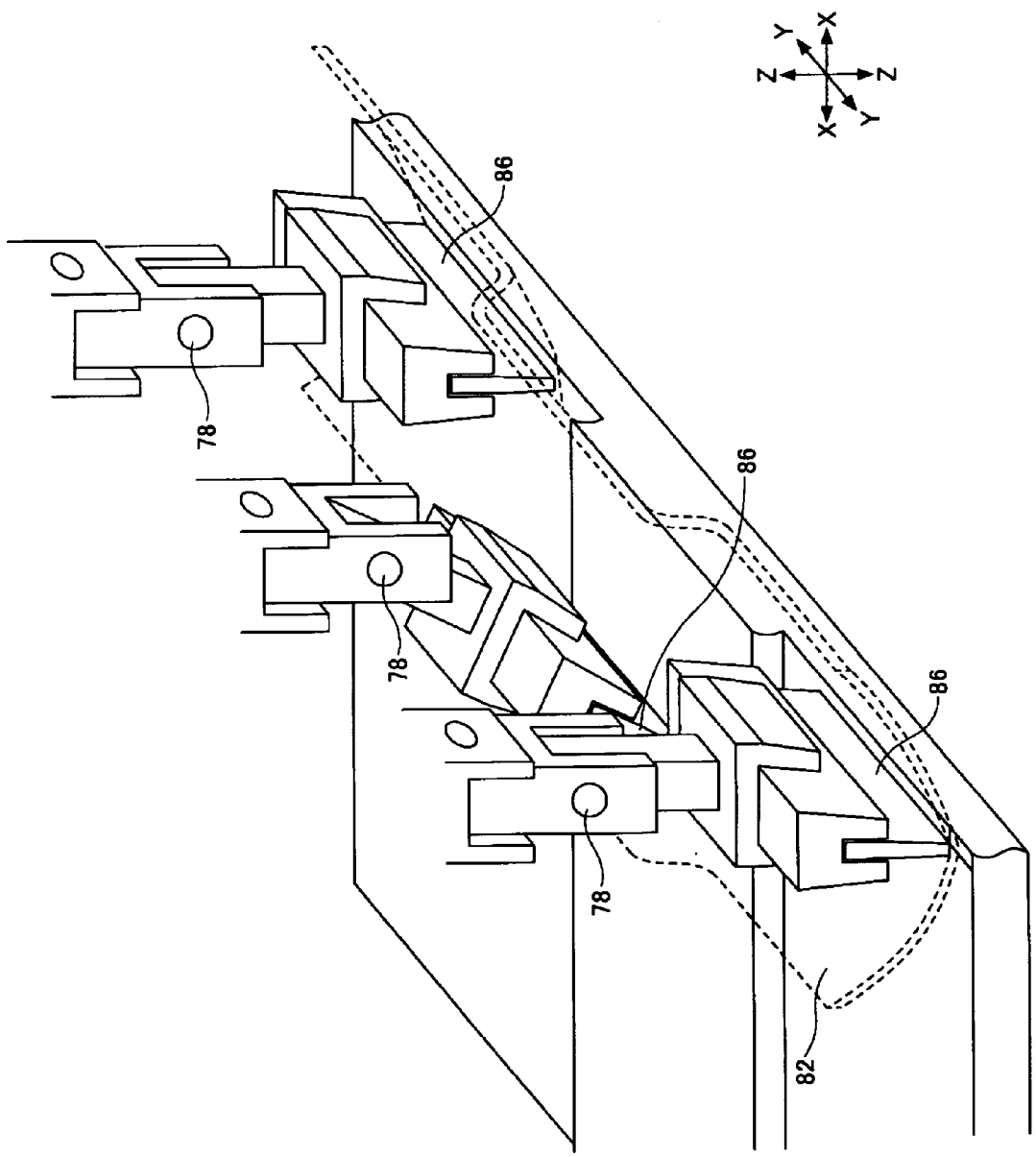
FIG. 13 is a view explaining the conductive ball removing apparatus according to a third variation of the first embodiment of the present invention, and shows a perspective view showing a state that a squeegee constituting a contacting mechanism comes into contact with a mask.

Also, as shown in FIG. 13, the oscillation mechanism 78 can be provided to upper portions of a plurality of squeegees 86 respectively. The oscillation mechanism 78 is configured to swing in the perpendicular direction to the extending direction of the contact face 76 of the sheet member 82 that comes in touch with the mask 12 in a state that the sheet member 82 comes into contact with the mask 12. Even when fine unevenness is present on the wiring substrate 18, the squeegees 86 can be slid and moved freely around the unevenness by providing such oscillation mechanism 78. Therefore, the squeegees 86 can follow the unevenness of the wiring substrate 18 more surely.

In this manner, according to exemplary embodiments of the present variation, by providing the plurality of squeegees 86 with the oscillation mechanism 78, even when the unevenness is present on the wiring substrate 18 or a warpage is present on the wiring substrate 18, the sheet member 82 can come surely into contact with the mask 12. Thus, productivity can be improved in the step of removing the conductive balls 38 that have not been directly mounted on the pads 27. Also, the squeegees 86 may be inclined in parallel with the extending direction.

In the present variation, although an example in which the squeegees 86 divided in plural and the oscillation mechanism 78 provided to the squeegees 86 are described, the similar advantages can be achieved by employing either of the case where a plurality of squeegees 86 are provided and the case where the oscillation mechanism 78 is provided respectively.

Fourth Variation

Figure 21:
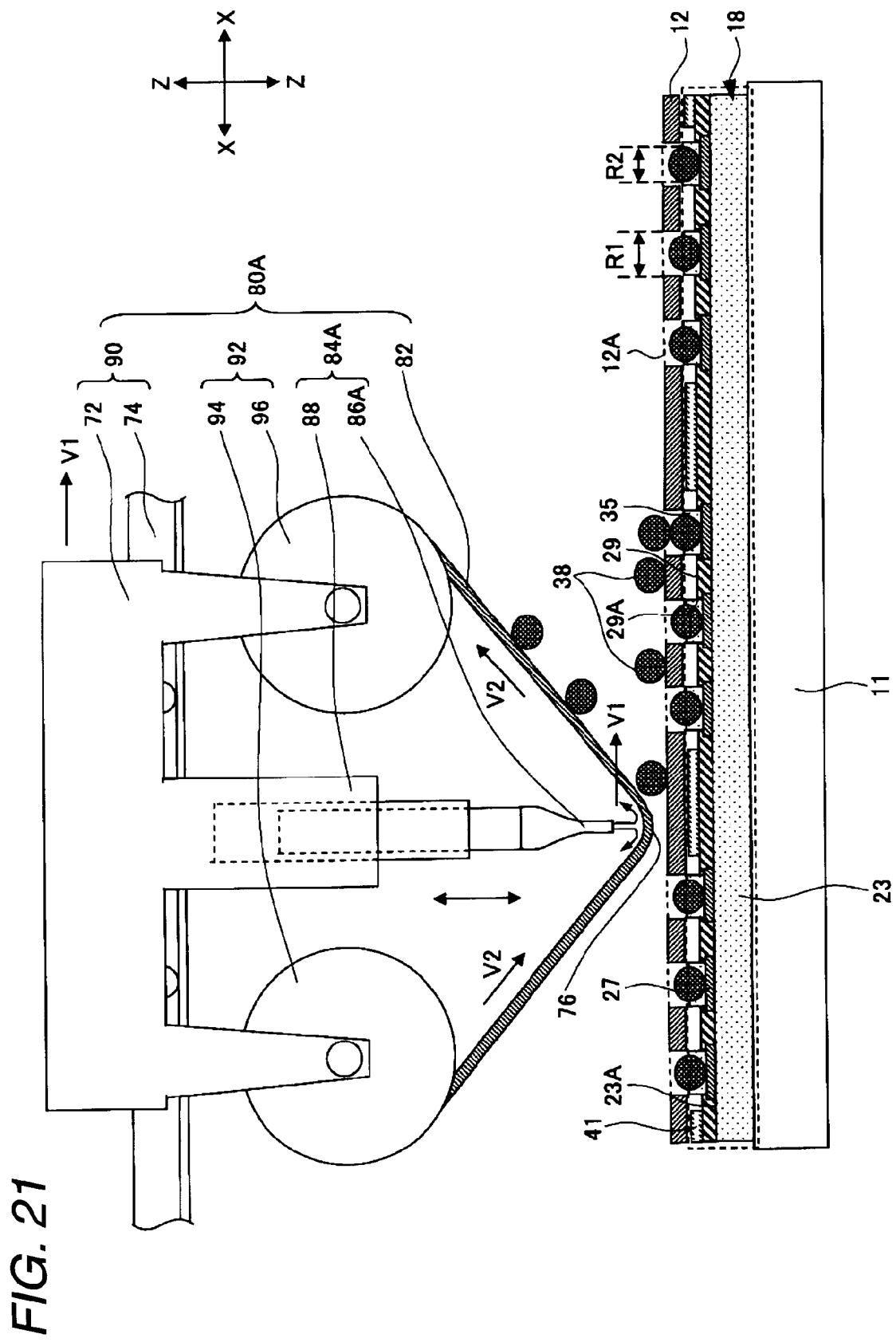
FIG. 21 is a schematic view showing a state that conductive balls are removed using a conductive ball removing apparatus according to a fourth variation of the first embodiment of the present invention.

Next, a fourth variation of the first embodiment will be explained with reference to FIG. 21 hereunder.

A conductive ball removing apparatus 80A according to the present variation is different from the first embodiment in that, in the first embodiment, the contacting mechanism 84 brings the squeegee 86 into contact with the sheet member 82 whereas, in the present variation, a contacting mechanism 84A blows out an air jet and the air pressure brings the squeegee 86 into contact with the sheet member 82.

Figure 22:
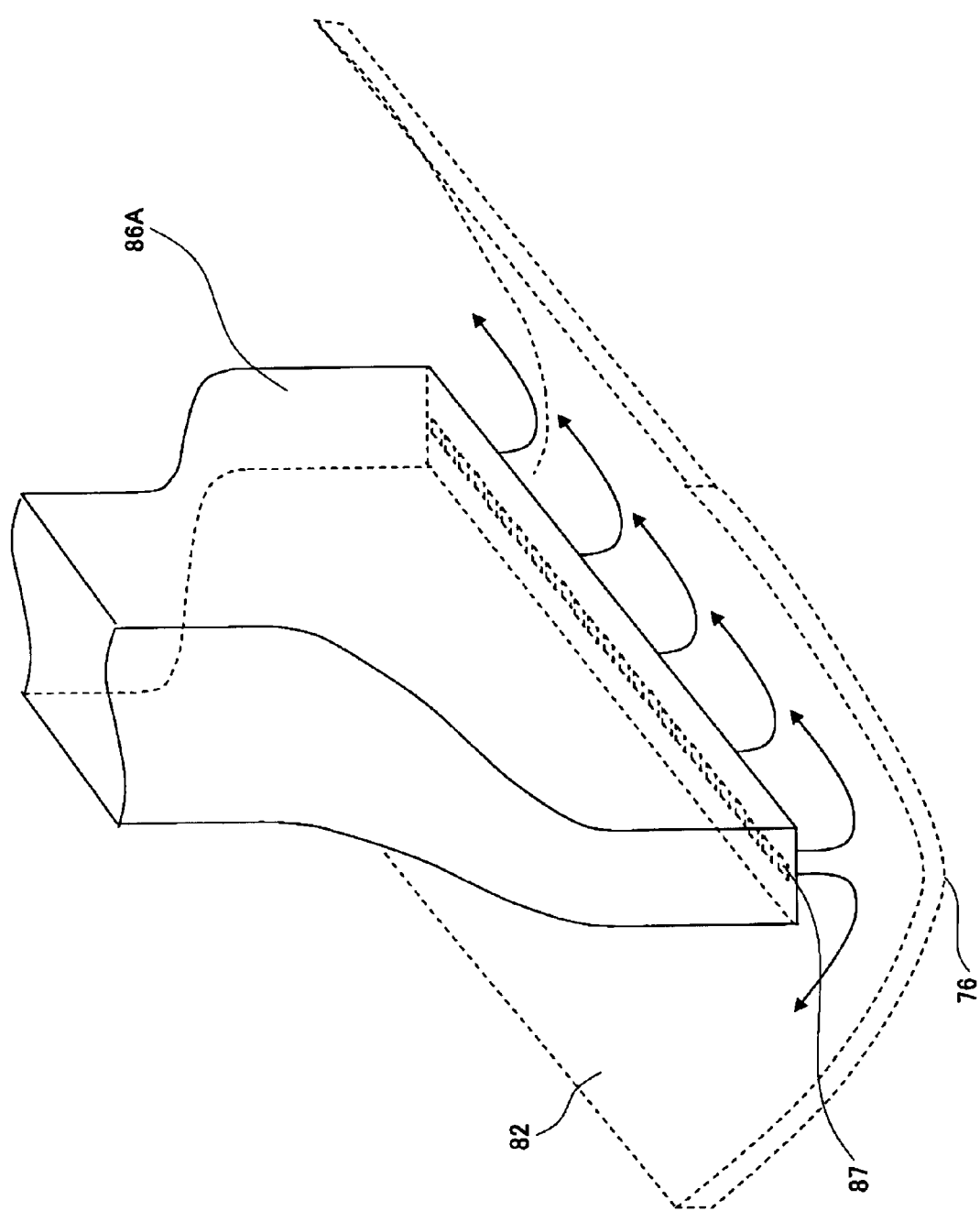
FIG. 22 is a view explaining the conductive ball removing apparatus according to the fourth variation of the first embodiment of the present invention, and shows a perspective view of an air nozzle constituting a contacting mechanism.

Concretely, in the first embodiment, the squeegee 86 and the cylinder 88 are used as the contacting mechanism 84, the metal squeegee is used as the squeegee 86, and the air cylinder is used as the cylinder 88. Meanwhile, in the present variation, an air nozzle 86A and the cylinder 88 are used as the contacting mechanism 84. As in the first embodiment, for example, the air cylinder can be used as the cylinder 88. The air nozzle 86A blows out an air toward the sheet member 82 from a top end of the air nozzle 86A such that the sheet member 82 is brought into contact with the mask 12 by an air pressure of the air that is blown to the sheet member 82. A perspective view of the air nozzle 86A is shown in FIG. 22. As shown in FIG. 22, a bottom surface of the air nozzle 86A has a short strip-shape that is long in one direction and is short in the direction perpendicular to this one direction. Also, a plurality of orifices 87 for jetting an air are formed in the bottom surface of the air nozzle 86A. For example, the air nozzle which has a strip bottom surface of 100 mm×6 mm and on which 32 orifices 87 having a square sectional shape of 0.9 mm×0.9 mm are aligned at an equal interval can be used.

Figure 23:
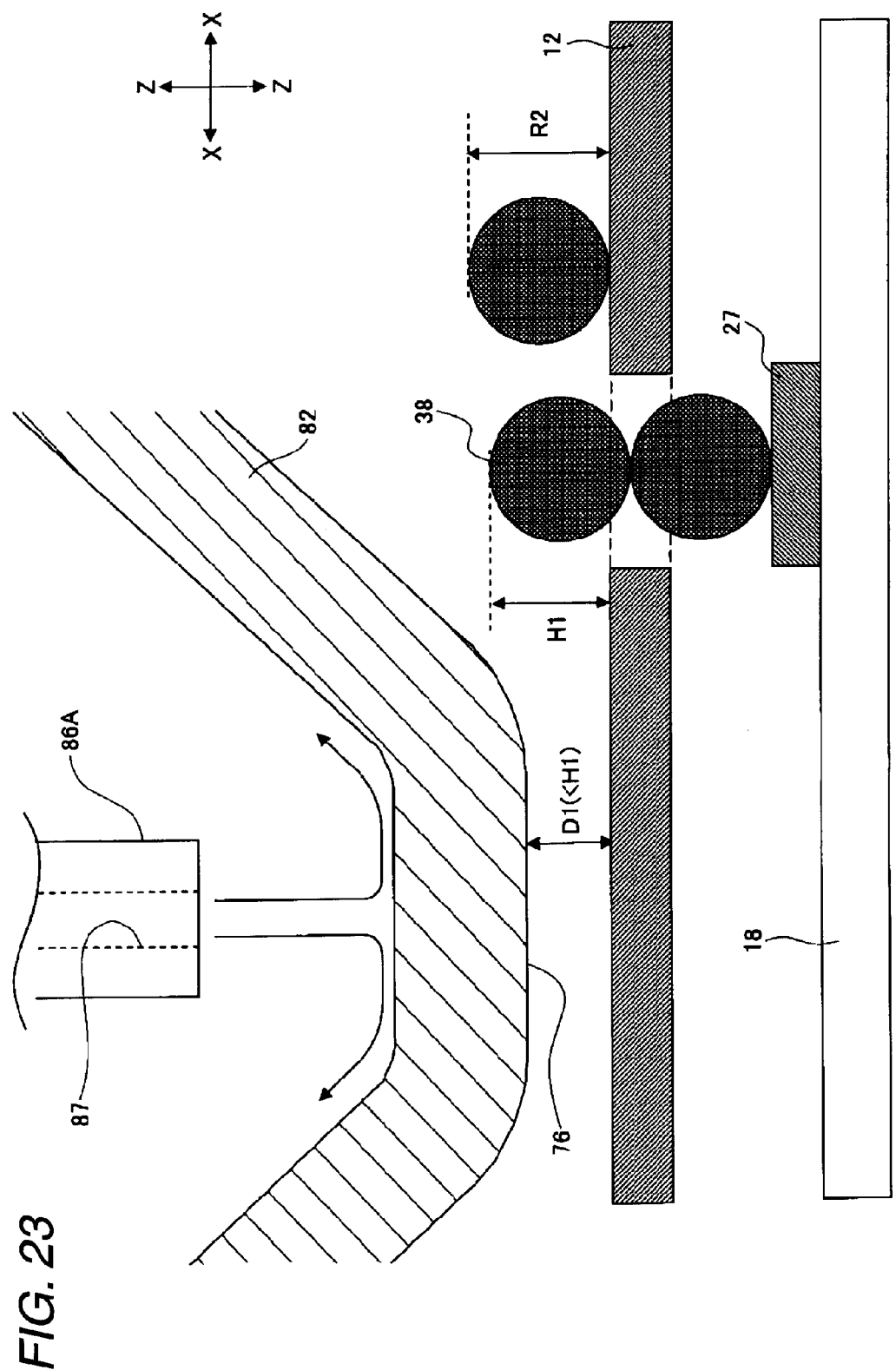
FIG. 23 is a view explaining the conductive ball removing apparatus according to a first variation of the first embodiment of the present invention, and shows an enlarged view of a contact face, on which a sheet member is brought into contact with a mask, and its neighborhood.

FIG. 23 shows a state that the sheet member 82 is brought into contact with a mask 12 at its contact face 76 by an air pressure of the air that is blown out from the air nozzle 86A. As described in the first embodiment, the wording "the sheet member 82 comes into contact the mask 12 to remove the surplus conductive balls 38" contains such a meaning that the sheet member 82 comes close to the mask 12. This wording may be used when the sheet member 82 does not come into touch with the mask 12 but come close to the mask 12. The sheet member 82 may be controlled in such a manner that, even though the sheet member 82 does not come into touch with the mask 12, the distance D1 between the sheet member 82 and the mask 12 is made smaller than the distance H1 between an upper surface of the mask 12 and an upper surface of the conductive ball 38 that is mounted on the conductive ball 38 as the double ball. Therefore, the distance D1 is controlled in a range of D1<H1 by adjusting a height of the cylinder 88 and a pressure of the air blown out from the air nozzle 86A.

Here, when the sheet member 82 is pushed against the mask 12, the mask 12 is pushed strongly against the wiring substrate 18 and then the adhesive material 35 coated on the wiring substrate 18 is adhered onto the mask 12 to block the opening portions 29A of the mask 12. Therefore, the conductive balls 38 cannot be mounted on another wiring substrate 18 by using this mask 12.

In contrast, when an air is blown out from the air nozzle 86A so as to bring the sheet member 82 into contact with the mask 12, the sheet member 82 can be brought into contact with the mask 12 by a small force. The opening portions 29A of the mask 12 are never blocked by the adhesive material 35. Therefore, when the conductive balls 38 are mounted on another wiring substrate 18 by using the mask 12, the conductive balls 38 can be mounted on the pads 27 without fail.

Also, except that the air nozzle 86A and the cylinder 88 are used as the contacting mechanism 84A, a conductive ball removing method using the conductive ball removing apparatus 80A according to the present variation is similar to the conductive ball removing method shown in FIG. 6 to FIG. 10 according to the first embodiment of the present invention.

As described above, according to the present variation, the sheet member 82 is brought into contact with the mask 12 by an air pressure of the air that is blown out from the air nozzle 86A. Therefore, such a situation is never caused that the opening portions 29A of the mask 12 are blocked by the adhesive material 35 coated on the wiring substrate 18 when the mask 12 is pushed strongly. As a result, after the surplus conductive balls 38 are removed, the conductive balls 38 can be mounted on another wiring substrate 18 without fail.

Fifth Variation

Figure 24:
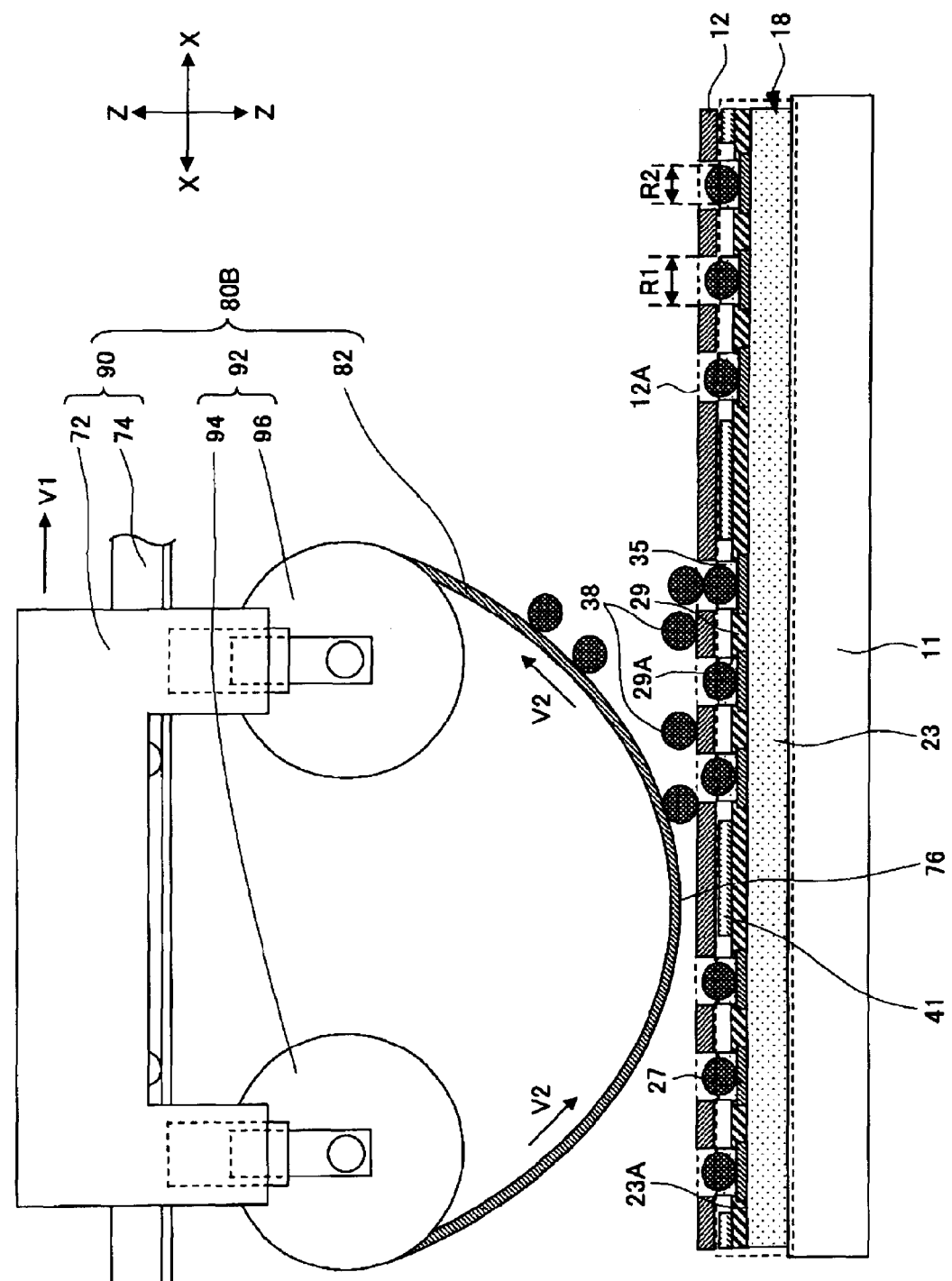
FIG. 24 is a schematic view showing a state that conductive balls are removed using a conductive ball removing apparatus according to a fifth variation of the first embodiment of the present invention.

Next, a fifth variation of the first embodiment will be explained with reference to FIG. 24 hereunder.

A conductive ball removing apparatus 80B according to the present variation is different from the first embodiment in that, in the first embodiment, the contacting mechanism 84 brings the squeegee 86 into contact with the sheet member 82 whereas, in the present variation, the sheet member 82 is brought into contact with the mask 12 by its own weight.

Concretely, in the first embodiment, the squeegee 86 and the cylinder 88 are used as the contacting mechanism 84, the metal squeegee is used as the squeegee 86, and the air cylinder is used as the cylinder 88. Meanwhile, in the present variation, no contacting mechanism is used and the sheet member 82 comes down by its own weight and is brought into the mask 82. In the present variation, the sheet member 82 is also controlled in such a manner that the distance D1 between the sheet member 82 and the mask 12 is made smaller than the distance H1 between the upper surface of the mask 12 and the upper surface of the conductive ball 38 that is mounted on the conductive ball 38 as the double ball. The control of the distance D1 is not particularly restricted, but this distance can be controlled by moving the winding roller 96 and the unwinding roller 94 vertically, for example.

Here, when the sheet member 82 is pushed against the mask 12, the mask 12 is pushed strongly against the wiring substrate 18 and then the adhesive material 35 coated on the wiring substrate 18 is adhered onto the mask 12 to block the opening portions 29A of the mask 12. Therefore, the conductive balls 38 cannot be mounted on another wiring substrate 18 by using this mask 12.

In contrast, according to the present variation, since the sheet member 82 comes into contact with the mask 12 by its own weight, the sheet member 82 can be brought into contact with the mask 12 by a small force. The opening portions 29A of the mask 12 are never blocked by the adhesive material 35 coated on the wiring substrate 18 when the mask 12 is strongly pushed. Therefore, after the surplus conductive balls 38 are removed, the conductive balls 38 can be mounted on another wiring substrate 18 without fail. Furthermore, if own weight of the sheet member 82 is heavy, a canceling mechanism which cancels the own weight using a spring or a cylinder may be provided.

Also, except that the contacting mechanism 84 is not used and the sheet member 82 brings itself into contact with the mask 12 by its own weight, a conductive ball removing method using the conductive ball removing apparatus 80B according to the present variation is similar to the conductive ball removing method shown in FIG. 6 to FIG. 10 according to the first embodiment of the present invention.

Sixth Variation

Figure 25:
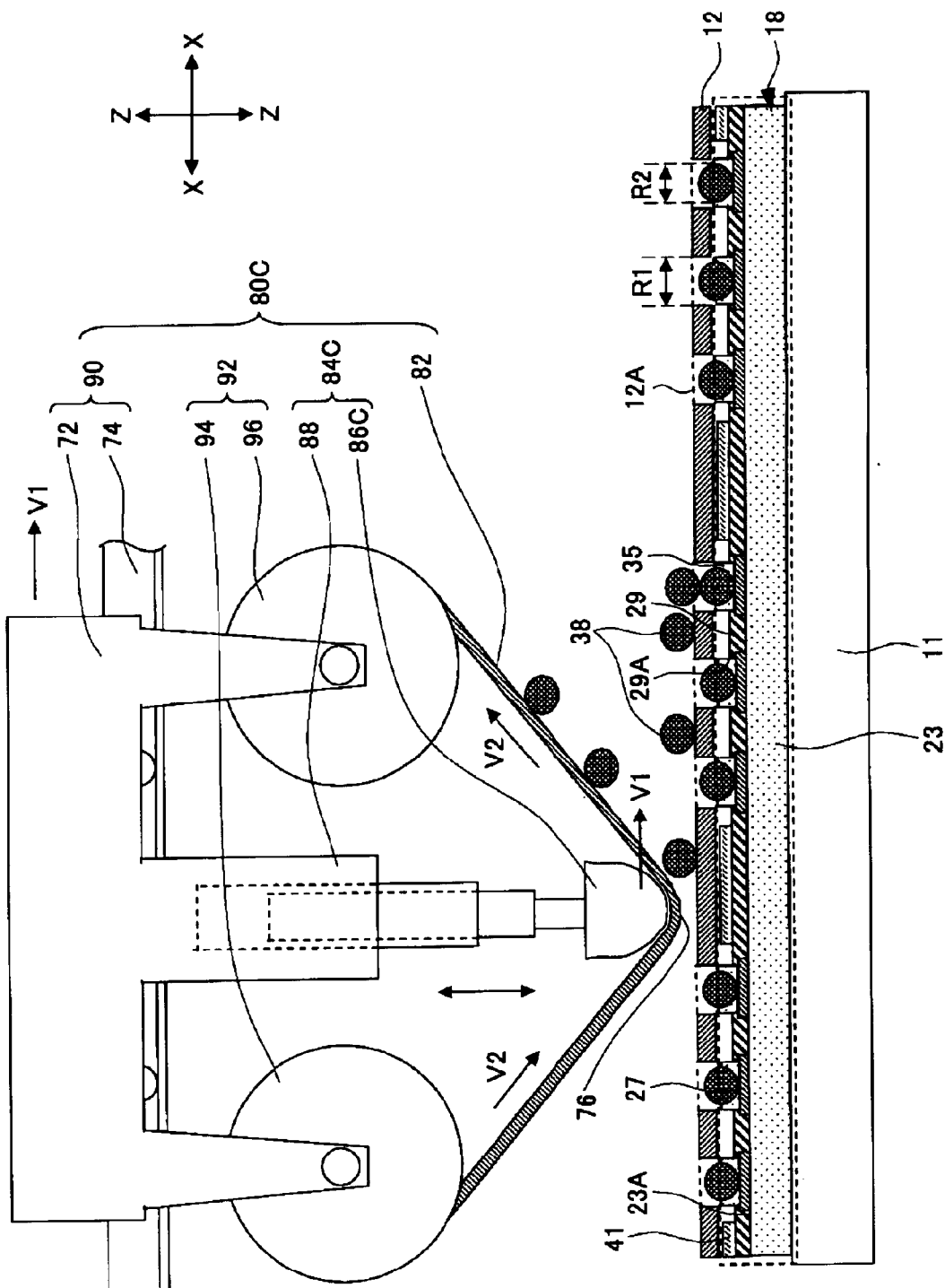
FIG. 25 is a schematic view showing a state that conductive balls are removed using a conductive ball removing apparatus according to a sixth variation of the first embodiment of the present invention.

Next, a sixth variation of the first embodiment will be explained with reference to FIG. 25 hereunder.

A conductive ball removing apparatus 80C according to the present variation is different from the first embodiment in that, in the first embodiment, the contacting mechanism 84 brings the squeegee 86 into contact with the sheet member 82. Meanwhile, in the present variation, a contacting mechanism 84C applies a force to the sheet member 82 via an elastic member having an elastic force so as to bring the sheet member 82 into contact with the mask 12.

Concretely, in the first embodiment, the squeegee 86 and the cylinder 88 are used as the contacting mechanism 84, the metal squeegee is used as the squeegee 86, and the air cylinder is used as the cylinder 88. Meanwhile, in the present variation, a sponge 86C as the elastic member having an elastic force is used instead of the squeegee 86. A contact face of the sponge 86C against the mask 12 has a rectangle shape on side of which is long in one direction and the other side of which is short in the direction perpendicular to this one direction, and is connected to the cylinder 88 via an arm. The sponge 86C is a member that is used to bring the sheet member 82 into contact with the mask 12. Also, any members having a convex portion can be used instead of the sponge 86C.

The contact face 76 of the sponge 86C against the mask 12 is a square face of 100 mm×20 mm, for example. Also, as the material of the sponge 86C, for example, polyurethane, melamine resin, rubber, or the like may be employed.

Figure 26:
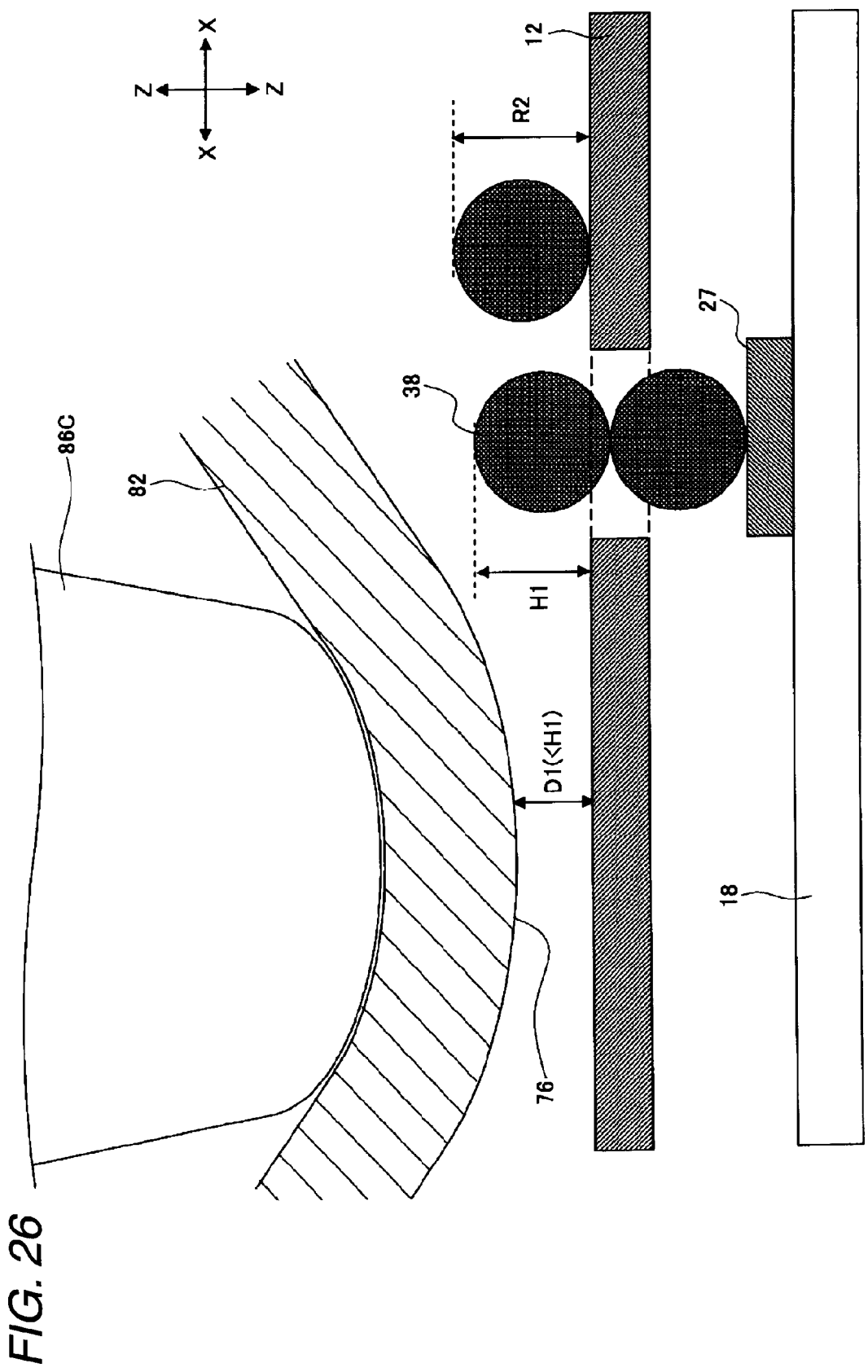
FIG. 26 is a view explaining the conductive ball removing apparatus according to the sixth variation of the first embodiment of the present invention, and shows an enlarged view of a contact face, on which a sheet member is brought into contact with a mask, and its neighborhood.

FIG. 26 shows a state that the sheet member 82 is brought into contact with the mask 12 at the contact face 76 by the sponge 86C. In the present variation, the sheet member 82 is also controlled in such a manner that the distance D1 between the sheet member 82 and the mask 12 is made smaller than the distance H1 between the upper surface of the mask 12 and the upper surface of the conductive ball 38 that is mounted on the conductive ball 38 as the double ball.

Here, when the sheet member 82 is pushed against the mask 12, the mask 12 is pushed strongly against the wiring substrate 18 and then the adhesive material 35 coated on the wiring substrate 18 is adhered onto the mask 12 to block the opening portions 29A of the mask 12. Therefore, the conductive balls 38 cannot be mounted on another wiring substrate 18 by using this mask 12.

In contrast, according to the present variation, since the sheet member 82 is brought into contact with the mask 12 by the sponge 86C, the sheet member 82 can be brought into contact with the mask 12 by a small force. The opening portions 29A of the mask 12 are never blocked by the adhesive material 35 coated on the wiring substrate 18 when the mask 12 is strongly pushed. Therefore, after the surplus conductive balls 38 are removed, the conductive balls 38 can be mounted on another wiring substrate 18 without fail.

Also, except that the sponge 86C as the elastic member having an elastic force is used instead of the squeegee 86, a conductive ball removing method using the conductive ball removing apparatus 80C according to the present variation is similar to the conductive ball removing method shown in FIG. 6 to FIG. 10 according to the first embodiment of the present invention.

In the present variation, the sponge 86C is used as the elastic member having an elastic force, the sponge 86C is brought into contact with the sheet member 82, and the sheet member 82 is brought into contact with the mask 12. In this case, the elastic member is not particularly limited to the sponge 86C, and any elastic member may be employed if such elastic member has an elastic force.

Second Embodiment

Next, a conductive ball removing apparatus according to a second embodiment of the present invention will be explained with reference to FIG. 14 hereunder. A conductive ball mounting apparatus 110 according to the present embodiment has a configuration in which a conductive ball mounting mechanism 130 and the conductive ball removing apparatus 80 of the first embodiment are combined together, and is different from the first embodiment in that the conductive ball mounting mechanism 130 is provided. Therefore, mainly the conductive ball mounting mechanism 130 as a difference from the first embodiment will be explained hereunder.

Figure 14:
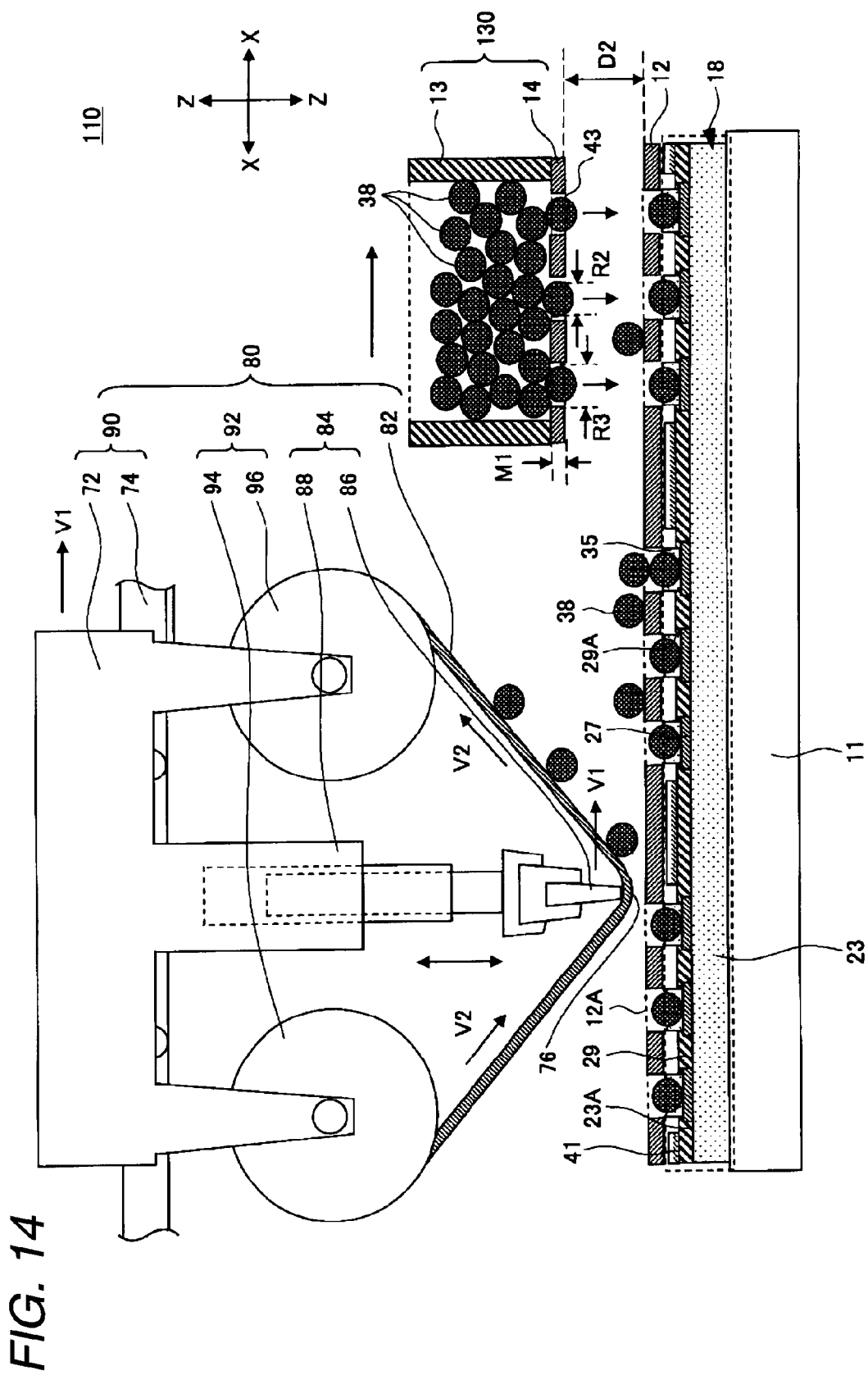
FIG. 14 is a schematic view showing a state that conductive balls are removed and mounted using a conductive ball mounting apparatus according to a second embodiment of the present invention.

FIG. 14 is a view explaining the conductive ball mounting apparatus 110, and showing schematically how a plurality of conductive balls 38 are dropped on the mask 12 from the conductive ball mounting mechanism 130 arranged over the mask 12 and then the surplus conductive balls 38 that have not been directly mounted on the pads 27 are removed by the conductive ball removing apparatus 80. Also, in FIG. 14, a Z-Z direction denotes the vertical direction and an X-X direction denotes the direction perpendicular to the Z-Z direction respectively. In this event, out of the configuration shown in FIG. 14 to FIG. 20 used in the following explanation, the same reference symbols as those explained above are affixed to the configuration corresponding to the configuration of the conductive ball removing apparatus 80 explained in the first embodiment and shown in FIG. 3, and their explanation will be omitted herein.

By reference to FIG. 14, the conductive ball mounting apparatus 110 includes the conductive ball mounting mechanism 130 and the conductive ball removing apparatus 80, and is disposed over the mask 12 fixed on the wiring substrate 18 held on the stage 11.

The conductive ball mounting mechanism 130 includes a conductive ball container 13 and a plate 14. The conductive ball container 13 contains a plurality of conductive balls 38, and is disposed over the mask 12.

The plate 14 is provided to the conductive ball container 13 to cover the lower end portion of the conductive ball container 13. The plate 14 is positioned over the mask 12 away from the mask 12 such that the conductive balls 38 that dropped onto the mask 12 are not sandwiched between the plate 14 and the mask 12. When the diameter R2 of the conductive ball 38 is 100 μm, a distance D2 between the plate 14 and the mask 12 can be set to 1 mm to 10 mm, for example. The plate 14 has a plurality of through portions 43 whose size is set to pass through only one conductive ball 38. When the diameter R2 of the conductive ball 38 is 100 μm, the diameter R3 of the through portion 43 can be set to 105 μm to 110 μm, for example.

The plate 14 is provided to control the number of the conductive balls 38 that are to be dropped onto the mask 12 such that many conductive balls 38 should not be dropped onto the mask 12 at a time. A thickness M1 of the plate 14 can be set to 80 μm, for example. Also, as the material of the plate 14, for example, a metal can be used.

In this manner, the conductive ball container 13 and the plate 14 are arranged in a position away from the mask 12 such that the conductive balls 38 that dropped onto the mask 12 are not sandwiched between the plate 14 and the mask 12. For example, even when warpage of the wiring substrate 18 occurs, such a situation can be eliminated that the conductive ball container 13 and the plate 14 contact the mask 12 or the conductive balls 38 are sandwiched between the conductive ball container 13 and the plate 14 and the mask 12. Therefore, productivity can be improved in the step of mounting the conductive ball 38 on a plurality of pads 27 respectively.

In this way, out of a plurality of conductive balls 38 that dropped onto the mask 12, only the conductive balls 38 that enter into the through portions 12A of the mask 12 can be put one the pads 27 on which the adhesive material 35 is formed.

In contrast, the conductive balls 38 that have not been mounted directly on the pads 27 and have been mounted on the mask 12 or the pad 27 as the double ball are removed from the upper surface of the wiring substrate 18 by the conductive ball removing apparatus 80. Also, the conductive ball removing apparatus 80 explained in the first embodiment is used as it is. The same reference symbols as those in the configuration explained above are affixed to the same constituent portions as the structure shown in FIG. 3, and their explanation will be omitted herein.

Since such conductive ball removing apparatus 80 is provided, the conductive balls 38, which have not been mounted on the pads 27 coated with the adhesive material 35, out of the plurality of conductive balls 38 that dropped onto the mask 12 can be removed.

FIG. 15 to FIG. 20 are process views explaining the conductive ball removing method using the conductive ball removing apparatus according to the second embodiment of the present invention. In FIG. 15 to FIG. 20, the same reference symbols are affixed to the same constituent portions as those in the structure explained previously and shown in FIG. 3. Also, in FIG. 19 and FIG. 20, C denotes a position in which the wiring substrate 18 is to be cut (referred to as a "cutting position C" hereinafter).

The conductive ball removing method according to the second embodiment of the present invention will be explained with reference to FIG. 15 to FIG. 20 hereunder.

Figure 15:
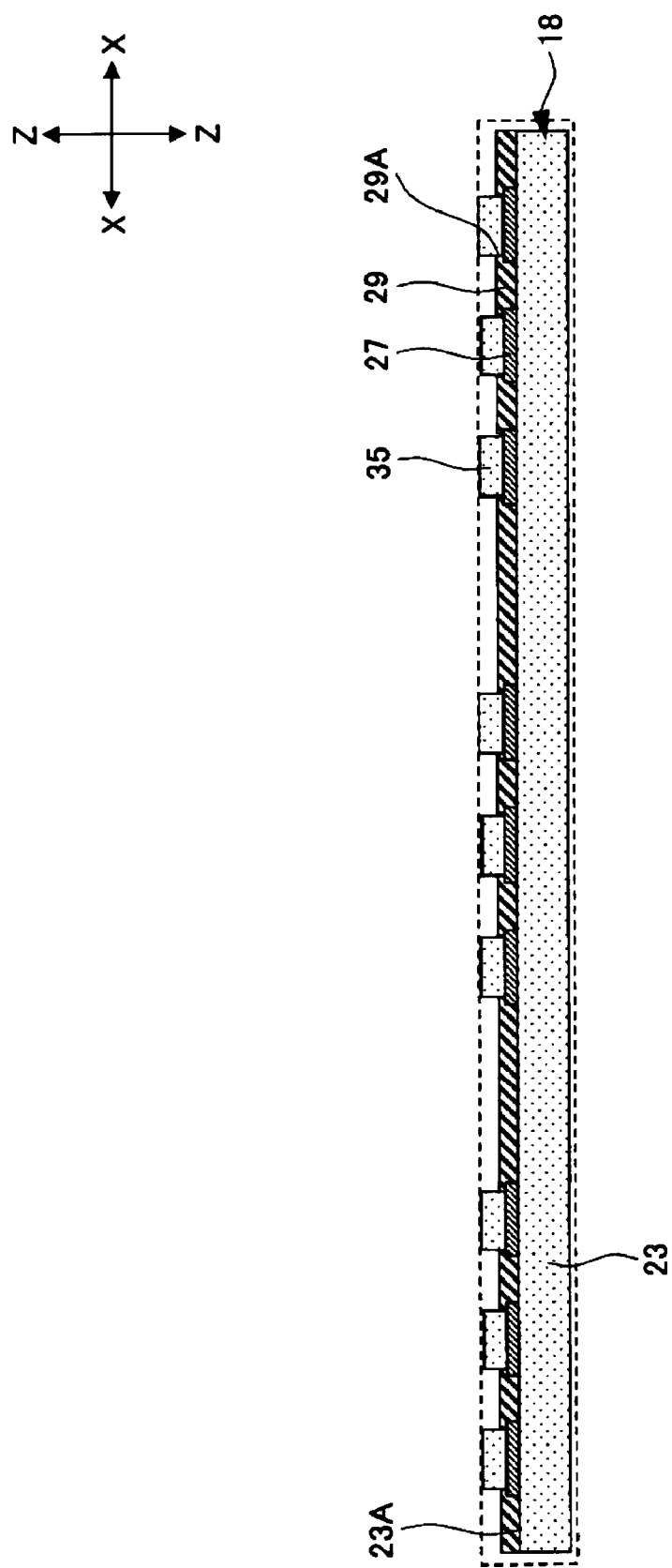
FIG. 15 is a process view (#1) explaining a conductive ball mounting method according to the second embodiment of the present invention.

At first, in steps shown in FIG. 15, the wiring substrate 18 in which the adhesive material 35 is provided on a plurality of pads 27 respectively is formed by the well-known approach.

Figure 16:
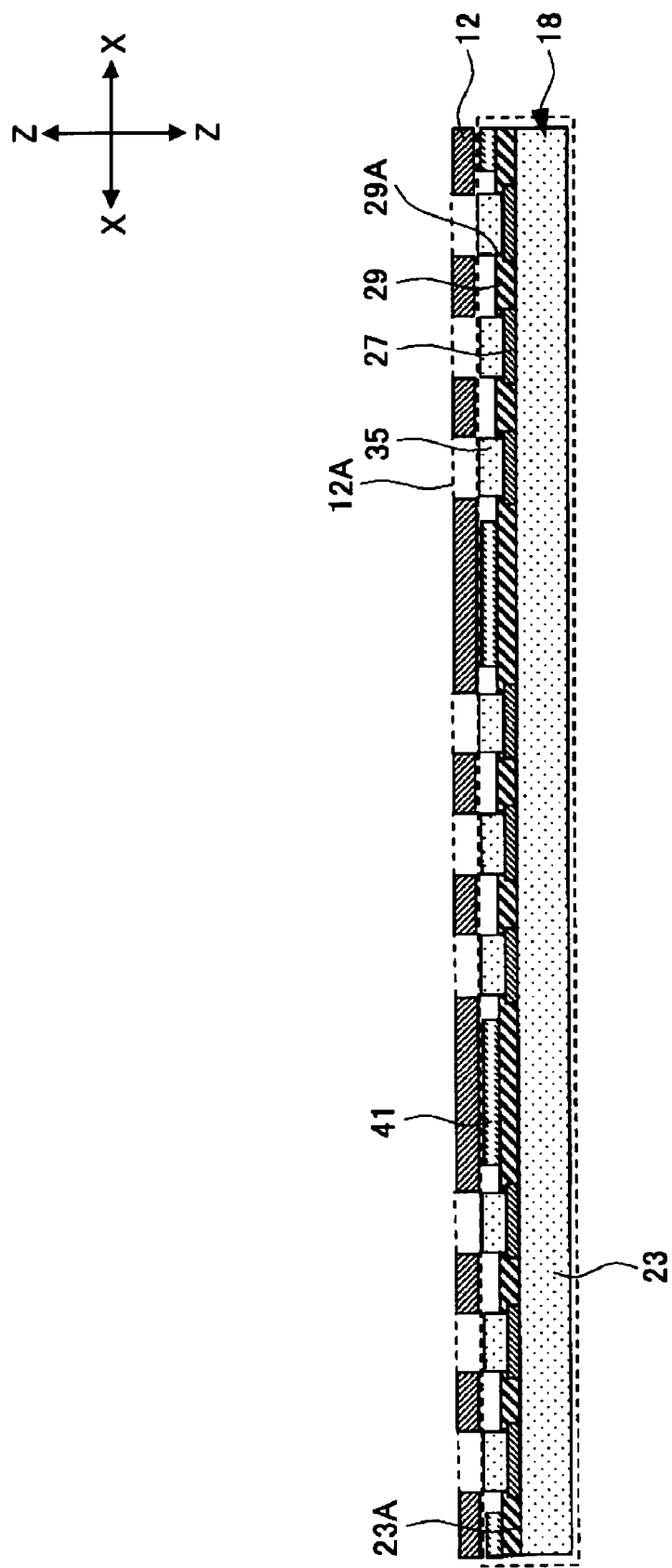
FIG. 16 is a process view (#2) explaining the conductive ball mounting method according to the second embodiment of the present invention.

Then, in steps shown in FIG. 16, the resist film 41 is formed on the solder resist 29, and then the mask 12 having a plurality of through portions 12A is fixed on the wiring substrate 18 via the resist film 41. At this time, the mask 12 is arranged such that the through portions 12A expose the adhesive material 35 formed on the pads 27.

Figure 17:
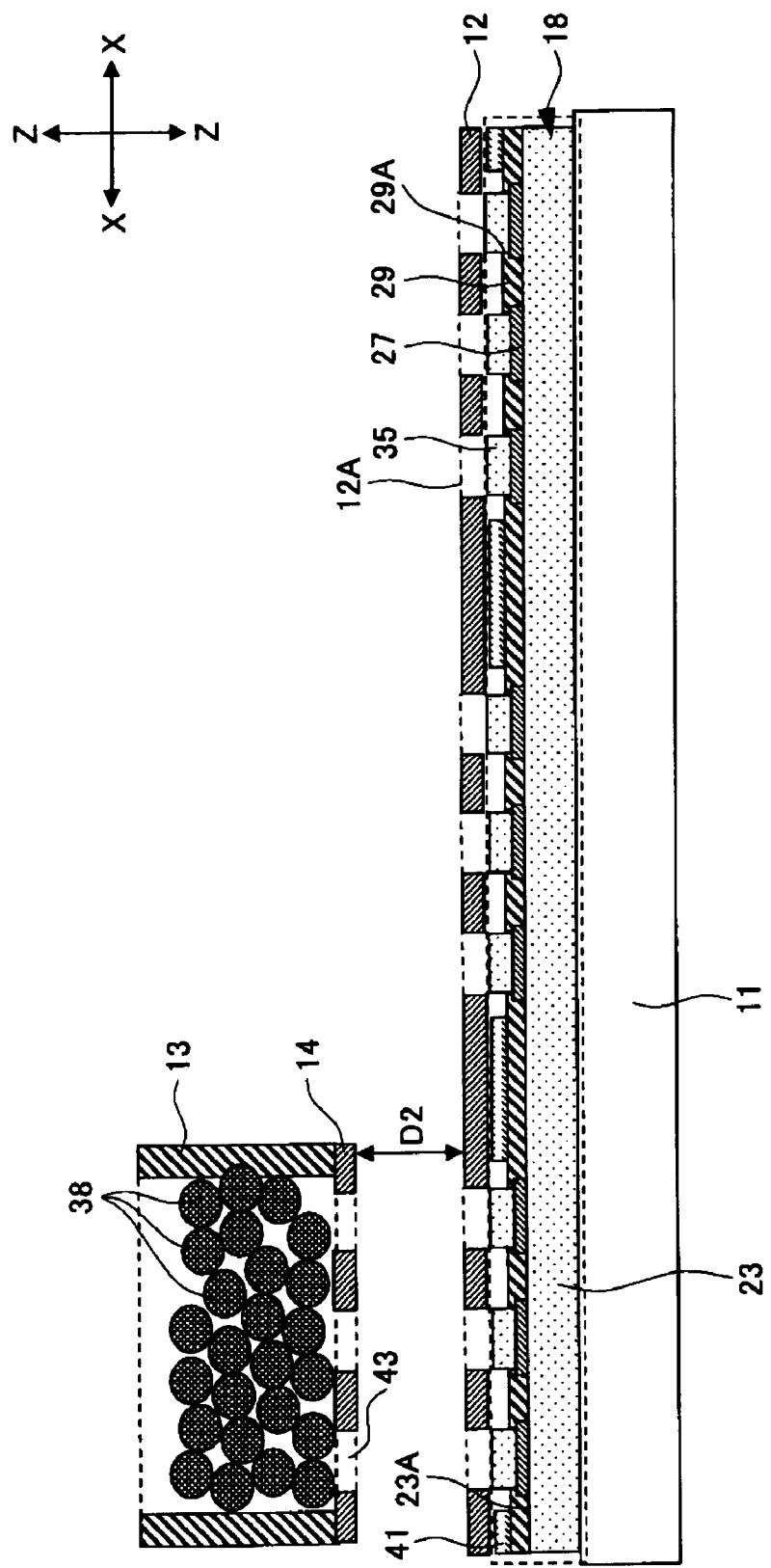
FIG. 17 is a process view (#3) explaining the conductive ball mounting method according to the second embodiment of the present invention.

Then, in steps shown in FIG. 17, a structure shown in FIG. 17 is fixed on the stage 11 such that the mask 12 and the plate 14 oppose to each other. As described in the explanation of the conductive ball mounting apparatus 110, the distance D2 between the plate 14 and the mask 12 can be set to 1 mm to 10 mm, for example, such that the conductive balls 38 that dropped onto the mask 12 are not sandwiched between the mask 12 and the plate 14.

Figure 18:
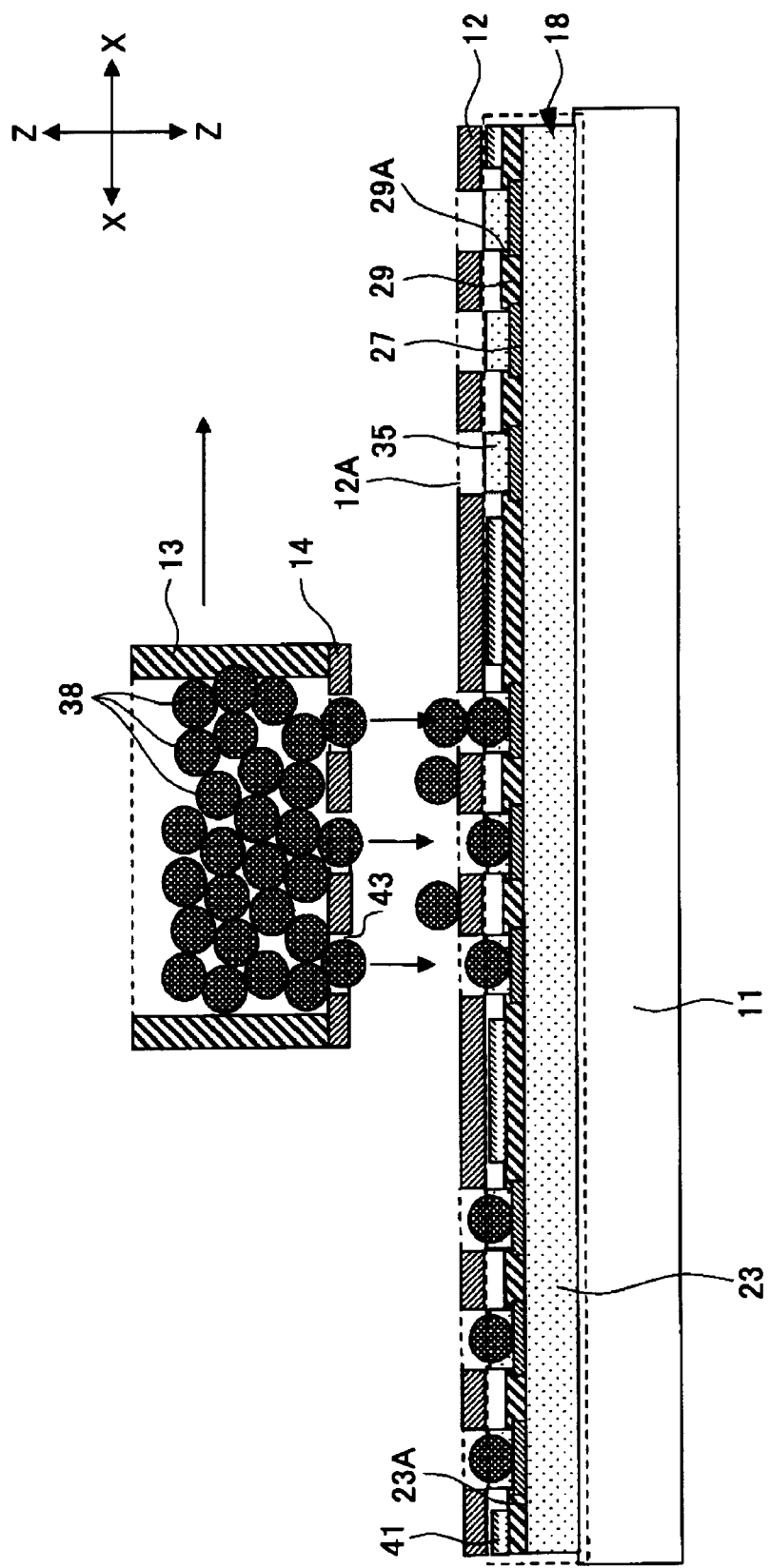
FIG. 18 is a process view (#4) explaining the conductive ball mounting method according to the second embodiment of the present invention.

Then, in steps shown in FIG. 18, the conductive ball container 13 containing a plurality of conductive balls 38 therein is moved in a state that the mask 12 and the plate 14 oppose to each other, and then a plurality of conductive balls 38 are dropped onto the mask 12 through a plurality of through portions 43 of the plate 14 by vibrating the conductive ball container 13. As a result, one conductive ball 38 is mounted on a plurality of pads 27 coated with the adhesive material 35.

Then, the extra conductive balls 38 that still remained on the mask 12 are removed by the conductive ball removing apparatus 80. The conductive ball removing method using the conductive ball removing apparatus 80 executes the steps explained in the first embodiment and shown in FIG. 6 to FIG. 10, and therefore their detailed explanation will be omitted herein. The sheet member 82 is brought into contact with the mask 12 by the contacting mechanism 84, and then the contact face 76 of the sheet member 82 is moved over the mask 12 by the moving mechanism 90 and simultaneously the contact face 76 of the sheet member 82 is updated by the updating mechanism 92. Therefore, the surplus conductive balls 38 can be removed surely.

Also, the removal of the conductive balls by the conductive ball removing apparatus 80 may be carried out along with the mounting of the conductive balls by the conductive ball mounting mechanism 130. When the removal of the conductive balls and the mounting of the conductive balls are executed at the same time, a time required for the removal of the conductive balls and the mounting of the conductive balls can be reduced. As a result, the productivity can be improved.

According to the above method, the conductive balls 38 can be mounted on all pads 27 on a one-to-one basis.

Figure 19:
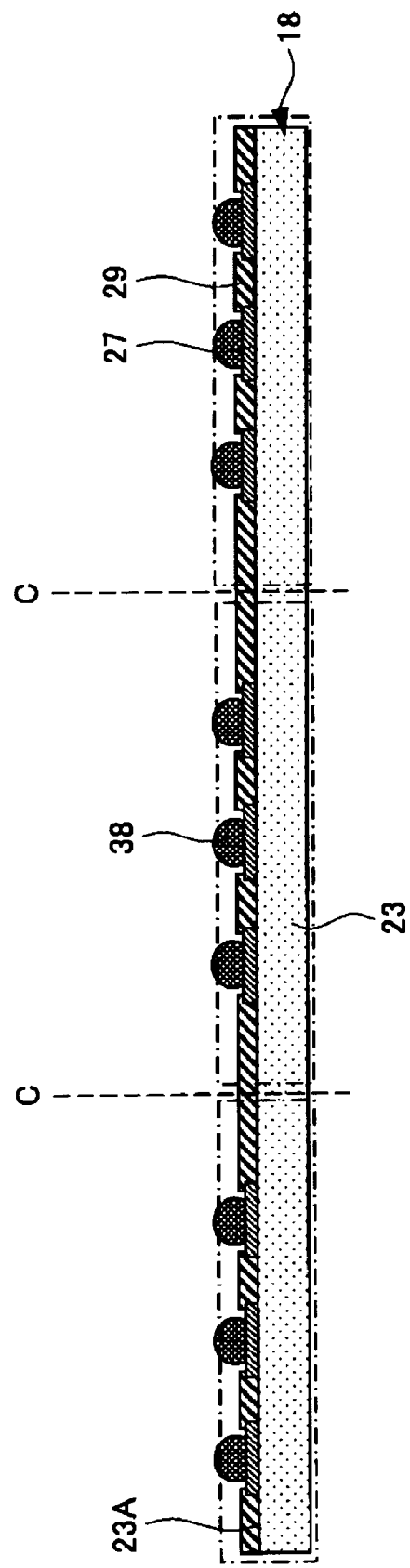
FIG. 19 is a process view (#5) explaining the conductive ball mounting method according to the second embodiment of the present invention.

Then, in steps shown in FIG. 19, the wiring substrate 18 on which the mask 12 is fixed is removed from the stage 11, and the resist film 41 and the mask 12 are removed from the wiring substrate 18 on which a plurality of conductive balls 38 are mounted. Then, the conductive balls 38 are bonded to the pads 27 by fusing the conductive balls 38 respectively, and then the adhesive material 35 is removed by the cleaning.

Figure 20:
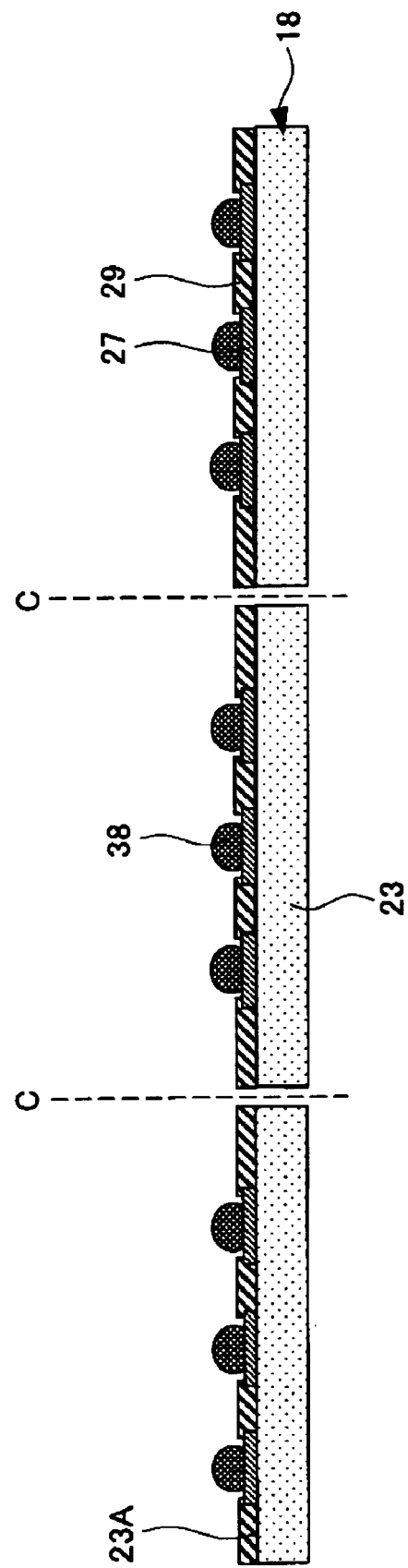
FIG. 20 is a process view (#6) explaining the conductive ball mounting method according to the second embodiment of the present invention.

Then, in steps shown in FIG. 20, the wiring substrate 18 to which the plurality of conductive balls 38 are bonded is cut along the cutting position C using the dicer. Accordingly, the plurality of wiring substrates 18 on which the conductive balls 38 are mounted are manufactured.

According to the conductive ball mounting method of the present embodiment, the conductive balls 38 are dropped onto the mask 12 from the conductive ball mounting mechanism 130, and then the surplus conductive balls 38 are removed from the whole surface of the wiring substrate 18 by the conductive ball removing apparatus 80 that can move the sheet member 82 while updating it. Also, even when warpage of the wiring substrate 18 occurs, such a situation can be eliminated that the conductive ball mounting mechanism 130 or the conductive ball removing apparatus 80 contacts the mask 12 or the conductive balls 38 are sandwiched between the conductive ball mounting mechanism 130 and the conductive ball removing apparatus 80. As a result, the productivity can be improved in the step of mounting the conductive balls 38 on a plurality of pads 27.

First Variation

Next, a first variation of the second embodiment will be explained with reference to FIG. 27 hereunder.

A conductive ball mounting apparatus 110A according to the present variation is different from the second embodiment in that, in the second embodiment, the conductive ball removing apparatus 80 according to the first embodiment is used whereas, in the present variation, the conductive ball removing apparatus 80A according to the fourth variation of the first embodiment is used.

Figure 27:
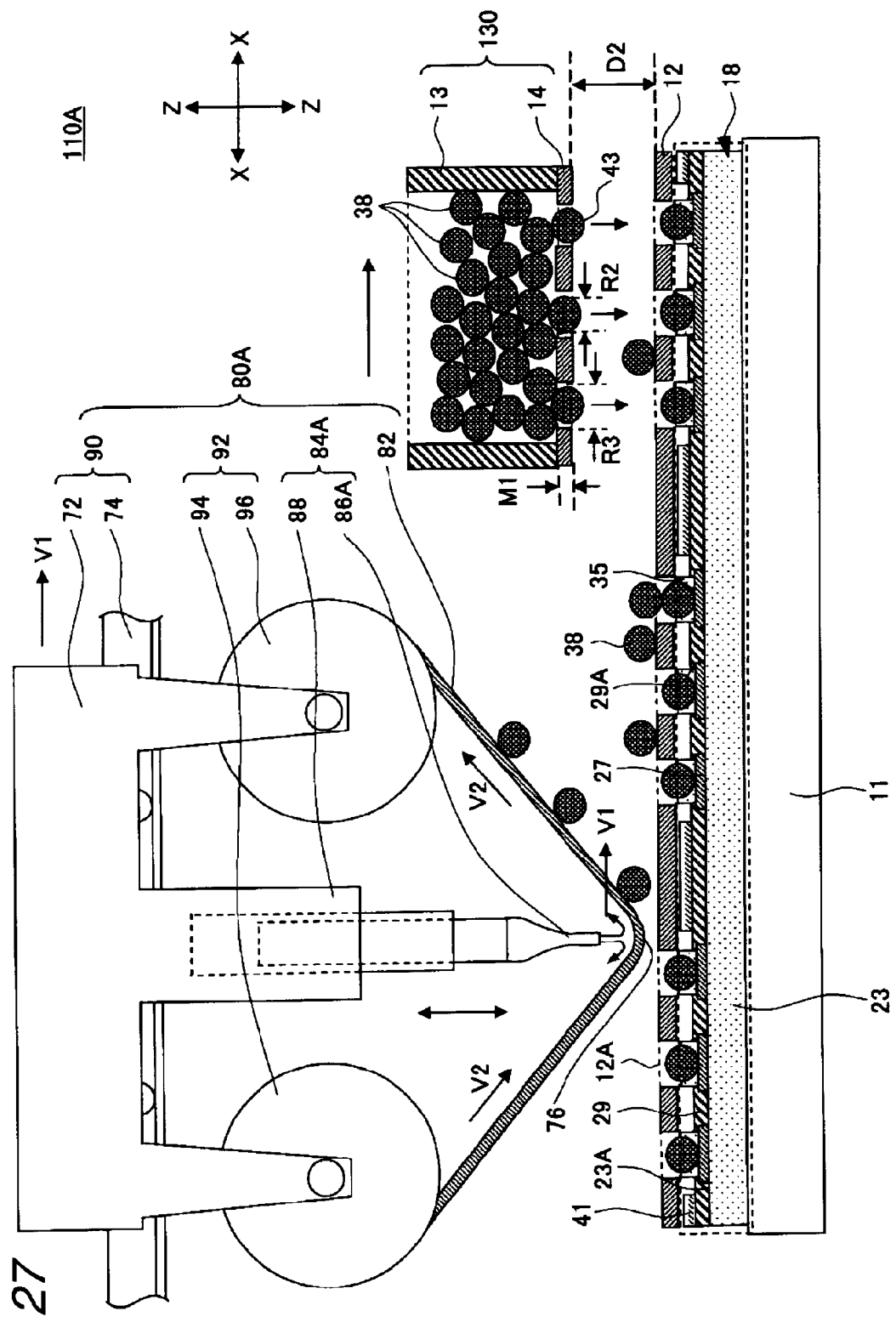
FIG. 27 is a schematic view showing a state that conductive balls are removed and mounted using a conductive ball mounting apparatus according to a first variation of the second embodiment of the present invention.

FIG. 27 is a view explaining the conductive ball mounting apparatus 110A, and showing schematically how a plurality of conductive balls 38 are dropped on the mask 12 from the conductive ball mounting mechanism 130 disposed over the mask 12 and then the surplus conductive balls 38 that have not been directly mounted on the pads 27 are removed by the conductive ball removing apparatus 80A. Also, in FIG. 27, a Z-Z direction denotes the vertical direction and an X-X direction denotes the direction perpendicular to the Z-Z direction respectively.

By reference to FIG. 27, the conductive ball mounting apparatus 110A includes the conductive ball mounting mechanism 130 and the conductive ball removing apparatus 80A, and is disposed over the mask 12 fixed on the wiring substrate 18 held on the stage 11.

In the present variation, the configuration and the function for mounting the conductive balls 38 of the conductive ball mounting mechanism 130 are identical to those of the second embodiment.

In contrast, the conductive balls 38 being mounted on the mask 12 or the pads 27 as the double ball are removed from the upper surface of the wiring substrate 18 by the conductive ball removing apparatus 80A. As the conductive ball removing apparatus 80A, the conductive ball removing apparatus 80A explained in the fourth variation of the first embodiment is used as it is.

Since such conductive ball removing apparatus 80A is provided, the conductive balls 38 that have not been mounted on the pads 27 can be removed without fail. Also, the sheet member 82 can be brought into contact with the mask 12 by a small force while using the air nozzle 86A. Therefore, the opening portions 29A of the mask 12 are never blocked by the adhesive material 35 coated on the wiring substrate 18 when the mask 12 is strongly pushed. Therefore, after the surplus conductive balls 38 are removed, the conductive balls 38 can be mounted on another wiring substrate 18 without fail.

Also, a conductive ball mounting method using the conductive ball mounting apparatus according to the present variation is similar to the conductive ball mounting method using the conductive ball mounting apparatus 110 shown in FIG. 15 to FIG. 20 according to the second embodiment of the present invention.

In this event, each of the conductive balls 38 is mounted on corresponding one of the plurality of pads 27 in the steps shown in FIG. 18. Then, the step of removing the extra conductive balls 38 left on the mask 12 is carried out by using the conductive ball removing apparatus 80A. That is, when the steps shown in FIG. 6 to FIG. 10 in the first embodiment are performed, the conductive ball removing apparatus 80A is used instead of the conductive ball removing apparatus 80 shown in FIG. 6 to FIG. 10. The function of removing the extra conductive balls 38 in the conductive ball removing apparatus 80A is similar to the conductive ball removing apparatus 80, and the surplus conductive balls 38 can be removed surely.

Also, the conductive balls may be removed using the conductive ball removing apparatus 80A while the conductive balls are mounted using the conductive ball mounting mechanism 130. Accordingly, as in the second embodiment, a time required for the removal of the conductive balls and the mounting of the conductive balls can be reduced.

According to the above method, the conductive balls 38 can be mounted on all pads 27 on a one-to-one basis.

Then, the steps shown in FIG. 19 and FIG. 20 are similar to those of the second embodiment.

According to the conductive ball mounting method of the present variation, the surplus conductive balls 38 are removed from the whole surface of the wiring substrate 18 by the conductive ball removing apparatus 80A. The sheet member 82 can be brought into contact with the mask 12 by a small force while using the air nozzle 86A. Therefore, such an event can be eliminated that, when the mask 12 is strongly pushed, the adhesive material 35 is adhered onto the mask 12 and the opening portions 29A of the mask 12 are blocked by the adhesive material 35. As a result, after the surplus conductive balls 38 are removed, the conductive balls 38 can be mounted on another wiring substrate 18 without fail. Therefore, productivity can be improved in the step of mounting each of the conductive balls 38 on corresponding one of the plurality of pads 27.

Second Variation

Next, a second variation of the second embodiment will be explained with reference to FIG. 28 hereunder.

A conductive ball mounting apparatus 110B according to the present variation is different from the second embodiment in that, in the second embodiment, the conductive ball removing apparatus 80 according to the first embodiment is used whereas, in the present variation, the conductive ball removing apparatus 80B according to the fifth variation of the first embodiment is used.

Figure 28:
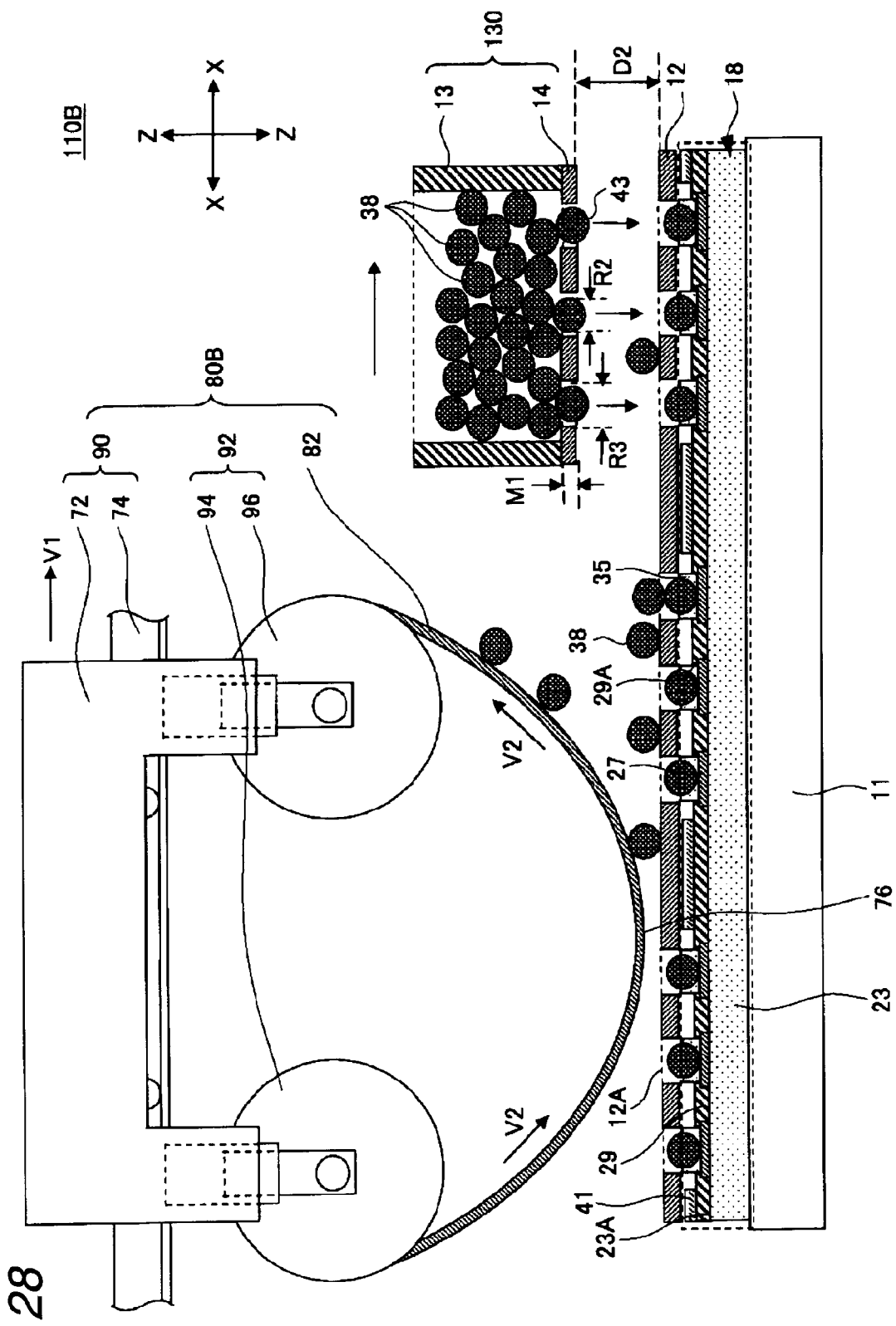
FIG. 28 is a schematic view showing a state that conductive balls are removed and mounted using a conductive ball mounting apparatus according to a second variation of the second embodiment of the present invention.

FIG. 28 is a view explaining the conductive ball mounting apparatus 110A, and showing schematically how the plurality of conductive balls 38 are dropped on the mask 12 from the conductive ball mounting mechanism 130 disposed over the mask 12 and then the surplus conductive balls 38 that have not been directly mounted on the pads 27 are removed by the conductive ball removing apparatus 80B. Also, in FIG. 28, a Z-Z direction denotes the vertical direction and an X-X direction denotes the direction perpendicular to the Z-Z direction respectively.

By reference to FIG. 28, the conductive ball mounting apparatus 110B includes the conductive ball mounting mechanism 130 and the conductive ball removing apparatus 80B, and is disposed over the mask 12 fixed on the wiring substrate 18 held on the stage 11.

In the present variation, the configuration and the function of mounting the conductive balls 38 of the conductive ball mounting mechanism 130 are identical to those of the second embodiment.

In contrast, the conductive balls 38 being mounted on the mask 12 or the pads 27 as the double ball are removed from the upper surface of the wiring substrate 18 by the conductive ball removing apparatus 80B. As the conductive ball removing apparatus 80A, the conductive ball removing apparatus 80A explained in the fifth variation of the first embodiment is used as it is.

Since such conductive ball removing apparatus 80B is provided, the conductive balls 38 that have not been mounted on the pads 27 can be removed without fail. Also, the sheet member 82 can be brought into contact with the mask 12 with a small force by means of its own weight. Therefore, such an event can be eliminated that, when the mask 12 is strongly pushed, the adhesive material 35 is adhered onto the mask 12 and the opening portions 29A of the mask 12 are blocked by the adhesive material 35. Therefore, after the surplus conductive balls 38 are removed, the conductive balls 38 can be mounted on another wiring substrate 18 without fail.

Also, a conductive ball mounting method using the conductive ball mounting apparatus according to the present variation is similar to the conductive ball mounting method using the conductive ball mounting apparatus 110 shown in FIG. 15 to FIG. 20 according to the second embodiment of the present invention.

In this event, firstly, each of the conductive balls 38 is mounted on the respective one of the plurality of pads 27 as shown in FIG. 18. Then, the extra conductive balls 38 left on the mask 12 are removed using the conductive ball removing apparatus 80B. That is, when the steps shown in FIG. 6 to FIG. 10 in the first embodiment are performed, the conductive ball removing apparatus 80B is used instead of the conductive ball removing apparatus 80 shown in FIG. 6 to FIG. 10. The function for removing the extra conductive balls 38 in the conductive ball removing apparatus 80B is similar to the conductive ball removing apparatus 80, and the surplus conductive balls 38 can be removed surely.

Also, the conductive balls may be removed by the conductive ball removing apparatus 80B while the conductive balls are mounted by the conductive ball mounting mechanism 130. Accordingly, as in the second embodiment, a time required for the removal of the conductive balls and the mounting of the conductive balls can be reduced.

According to the above method, the conductive balls 38 can be mounted on all pads 27 on a one-to-one basis.

Then, the steps shown in FIG. 19 and FIG. 20 are similar to those of the second embodiment.

According to the conductive ball mounting method of the present variation, the surplus conductive balls 38 are removed from the whole surface of the wiring substrate 18 by the conductive ball removing apparatus 80B. The sheet member 82 can be brought into contact with the mask 12 with a small force by means of its own weight. Therefore, such an event can be eliminated that, when the mask 12 is strongly pushed, the adhesive material 35 is adhered onto the mask 12 and the opening portions 29A of the mask 12 are blocked by the adhesive material 35. As a result, after the surplus conductive balls 38 are removed, the conductive balls 38 can be mounted on another wiring substrate 18 without fail. Therefore, productivity can be improved in the step of mounting each of the conductive balls 38 on the respective one of the plurality of pads 27.

Third Variation

Next, a third variation of the second embodiment will be explained with reference to FIG. 29 hereunder.

A conductive ball mounting apparatus 110C according to the present variation is different from the second embodiment in that, in the second embodiment, the conductive ball removing apparatus 80 according to the first embodiment is used whereas, in the present variation, the conductive ball removing apparatus 80C according to the sixth embodiment of the first embodiment is used.

Figure 29:
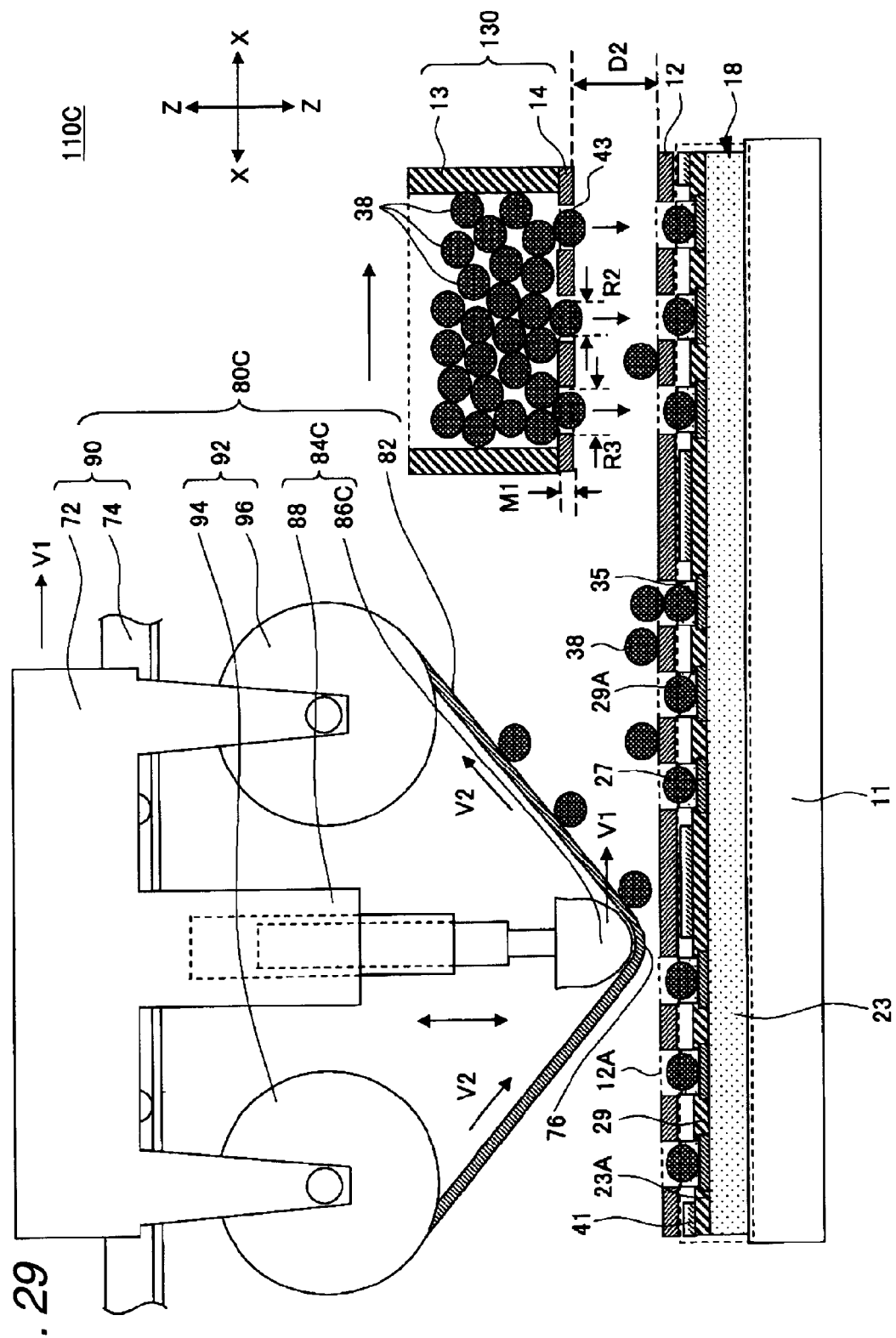
FIG. 29 is a schematic view showing a state that conductive balls are removed and mounted using a conductive ball mounting apparatus according to a third variation of the second embodiment of the present invention.

FIG. 29 is a view explaining the conductive ball mounting apparatus 110C, and showing schematically how the plurality of conductive balls 38 are dropped on the mask 12 from the conductive ball mounting mechanism 130 disposed over the mask 12 and then the surplus conductive balls 38 that have not been directly mounted on the pads 27 are removed by the conductive ball removing apparatus 80C. Also, in FIG. 29, a Z-Z direction denotes the vertical direction and an X-X direction denotes the direction perpendicular to the Z-Z direction respectively.

By reference to FIG. 29, the conductive ball mounting apparatus 110C includes the conductive ball mounting mechanism 130 and the conductive ball removing apparatus 80C, and is disposed over the mask 12 fixed on the wiring substrate 18 held on the stage 11.

In the present variation, the configuration and the function of mounting the conductive balls 38 of the conductive ball mounting mechanism 130 are identical to those of the second embodiment.

In contrast, the conductive balls 38 being mounted on the mask 12 or the pads 27 as the double ball are removed from the upper surface of the wiring substrate 18 by the conductive ball removing apparatus 80C. As the conductive ball removing apparatus 80C, the conductive ball removing apparatus 80C explained in the fifth variation of the first embodiment is used as it is.

Since such conductive ball removing apparatus 80C is provided, the conductive balls 38 that have not been mounted on the pads 27 can be removed without fail. Also, the sheet member 82 can be brought into contact with the mask 12 with a small force by means of the sponge 86C. Therefore, such an event can be eliminated that, when the mask 12 is strongly pushed, the adhesive material 35 is adhered onto the mask 12 and the opening portions 29A of the mask 12 are blocked by the adhesive material 35. Therefore, after the surplus conductive balls 38 are removed, the conductive balls 38 can be mounted on another wiring substrate 18 without fail.

Also, a conductive ball mounting method using the conductive ball mounting apparatus according to the present variation is similar to the conductive ball mounting method using the conductive ball mounting apparatus 110 shown in FIG. 15 to FIG. 20 according to the second embodiment of the present invention.

In this event, firstly, each of the conductive balls 38 is mounted on the respective one of the plurality of pads 27 as shown in FIG. 18. Then, the extra conductive balls 38 left on the mask 12 are removed using the conductive ball removing apparatus 80C. That is, when the steps shown in FIG. 6 to FIG. 10 in the first embodiment are performed, the conductive ball removing apparatus 80C is used instead of the conductive ball removing apparatus 80 in FIG. 6 to FIG. 10. The function of removing the extra conductive balls 38 in the conductive ball removing apparatus 80C is similar to the conductive ball removing apparatus 80, and the surplus conductive balls 38 can be removed surely.

Also, the conductive balls may be removed by the conductive ball removing apparatus 80B while the conductive balls are mounted using the conductive ball mounting mechanism 130. Accordingly, as in the second embodiment, a time required for the removal of the conductive balls and the placement of the conductive balls can be reduced.

According to the above method, the conductive balls 38 can be mounted on all pads 27 on a one-to-one basis.

Then, the steps shown in FIG. 19 and FIG. 20 are similar to those of the second embodiment.

According to the conductive ball mounting method of the present variation, the surplus conductive balls 38 are removed from the whole surface of the wiring substrate 18 by the conductive ball removing apparatus 80C. The sheet member 82 can be brought into contact with the mask 12 with a small force by means of the sponge 86C. Therefore, such an event can be eliminated that, when the mask 12 is strongly pushed, the adhesive material 35 is adhered onto the mask 12 and the opening portions 29A of the mask 12 are blocked by the adhesive material 35. As a result, after the surplus conductive balls 38 are removed, the conductive balls 38 can be mounted on another wiring substrate 18 without fail. Therefore, productivity can be improved in the step of mounting each of the conductive balls 38 on the respective one of the plurality of pads 27.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

For example, although, in the drawings, the conductive ball removing apparatus, the conductive ball mounting mecha- nism or the like is disposed over the mask or the wiring substrate, exemplary embodiments are not limited thereto. The conductive ball removing apparatus, the conductive ball mounting mechanism or the like may be disposed under the mask or the wiring substrate so as to face the mask.

What is claimed is:

1. A method of removing conductive balls that are left on a mask provided on a substrate having pads thereon, the method comprising:
   (a) making a sheet member close to the mask using a contacting mechanism such that a gap between the sheet member and the mask is set small than a diameter of the conductive balls,
   wherein the conductive balls are removed in such a manner that the conductive balls are adhered onto the sheet member, and
   wherein the contact mechanism includes a cylinder that controls a pressure between the sheet member and the conductive balls or the gap between the sheet member and the mask.

2. The method according to claim 1, wherein step (a) comprises: making the sheet member close to the mask by an air pressure from the contacting mechanism.

3. The method according to claim 1, wherein in step (a), the contacting mechanism applies a force to the sheet member via an elastic member.

4. The method according to claim 1, further comprising:
   (b) moving the sheet member over the mask.

5. The method according to claim 1, further comprising:
   (c) updating a contact face between the sheet member and the mask in response to a moving velocity of the sheet member.

6. The method according to claim 1, wherein when unevenness is present on the mask, the cylinder is movable up and down in response to the unevenness.

7. The method according to claim 1, wherein only the conductive balls that have not been directly mounted on the pads are removed by the sheet member.

* * * * *